United States Patent
Nakagawa et al.

(10) Patent No.: US 7,659,626 B2
(45) Date of Patent: Feb. 9, 2010

(54) SEMICONDUCTOR DEVICE INCLUDING A BARRIER METAL FILM

(75) Inventors: Hideo Nakagawa, Shiga (JP); Atsushi Ikeda, Shiga (JP); Nobuo Aoi, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/578,003

(22) PCT Filed: May 20, 2005

(86) PCT No.: PCT/JP2005/009268

§ 371 (c)(1),
(2), (4) Date: May 3, 2006

(87) PCT Pub. No.: WO2005/119751

PCT Pub. Date: Dec. 15, 2005

(65) Prior Publication Data

US 2007/0108616 A1   May 17, 2007

(30) Foreign Application Priority Data

Jun. 3, 2004   (JP) .............................. 2004-165361

(51) Int. Cl.
*H01L 23/52* (2006.01)
*H01L 21/4763* (2006.01)
*H01L 23/48* (2006.01)

(52) U.S. Cl. .............................. 257/751; 257/E23.145; 257/774; 257/E23.01; 257/E21.171; 257/E21.495; 438/643; 438/629

(58) Field of Classification Search ................ 257/751, 257/774, E23.145, E23.01, E21.171, E21.495; 438/629, 643
See application file for complete search history.

(56) References Cited

U.S. PATENT DOCUMENTS

| | | | | |
|---|---|---|---|---|
| 5,243,222 | A * | 9/1993 | Harper et al. | 257/774 |
| 6,261,953 | B1 * | 7/2001 | Uozumi | 438/687 |
| 6,639,318 | B1 | 10/2003 | Mitsui et al. | |
| 6,720,659 | B1 | 4/2004 | Akahori | |
| 6,747,353 | B2 | 6/2004 | Oizumi et al. | |
| 6,828,882 | B2 * | 12/2004 | Hidaka et al. | 333/204 |
| 7,053,487 | B2 * | 5/2006 | Saito et al. | 257/750 |
| 7,122,900 | B2 * | 10/2006 | Takeda et al. | 257/758 |

(Continued)

FOREIGN PATENT DOCUMENTS

JP   5-218035   8/1993

(Continued)

OTHER PUBLICATIONS

Japanese Notice of Reasons for Rejection, w/ English translation thereof, issued in Japanese Patent Application No. JP 2004-165361 dated Apr. 14, 2009.

*Primary Examiner*—Alexander O Williams
(74) *Attorney, Agent, or Firm*—McDermott Will & Emery LLP

(57) ABSTRACT

A semiconductor device includes an insulation film 6 formed on a silicon substrate 1, a buried metal interconnect 8 formed in the insulation film 6, and a barrier metal film 7 formed between the insulation film 6 and the metal interconnect 8. The barrier metal film 7 is a metal compound film. The metal compound film is characterized by including at least one of elements forming the insulation film.

5 Claims, 10 Drawing Sheets

U.S. PATENT DOCUMENTS

| | | |
|---|---|---|
| 2002/0001944 A1 | 1/2002 | Faust et al. |
| 2002/0029131 A1* | 3/2002 | Gumbel .................... 702/183 |
| 2002/0121703 A1* | 9/2002 | Toyoda et al. ............... 257/762 |
| 2003/0109129 A1* | 6/2003 | Saito et al. .................. 438/627 |
| 2003/0111730 A1* | 6/2003 | Takeda et al. ............... 257/758 |
| 2003/0116854 A1* | 6/2003 | Ito et al. ..................... 257/761 |
| 2004/0038520 A1 | 2/2004 | Seto et al. |
| 2004/0161942 A1* | 8/2004 | Tabaru ....................... 438/710 |
| 2004/0238964 A1* | 12/2004 | Kawano et al. ............. 257/758 |
| 2005/0023690 A1* | 2/2005 | Matsumura et al. ......... 257/758 |
| 2005/0093166 A1* | 5/2005 | Higashi et al. .............. 257/774 |
| 2006/0055046 A1* | 3/2006 | Kanamura ................... 257/758 |
| 2006/0097393 A1* | 5/2006 | Uchimaru et al. ........... 257/758 |
| 2006/0113674 A1* | 6/2006 | Toyoda et al. ............... 257/762 |
| 2006/0175708 A1* | 8/2006 | Ueno .......................... 257/774 |
| 2006/0180930 A1* | 8/2006 | Nguyen et al. .............. 257/758 |
| 2007/0007657 A1* | 1/2007 | Hineman et al. ............ 257/758 |
| 2007/0018330 A1* | 1/2007 | Takeda et al. ............... 257/762 |
| 2007/0148825 A1* | 6/2007 | Kikuta et al. ................ 438/118 |
| 2007/0252280 A1* | 11/2007 | Shimizu et al. .............. 257/758 |
| 2008/0176404 A1* | 7/2008 | Nagase et al. ............... 438/700 |
| 2008/0206983 A1* | 8/2008 | Sawayama et al. .......... 438/627 |
| 2008/0237863 A1* | 10/2008 | Toyoda et al. ............... 257/751 |
| 2008/0238964 A1* | 10/2008 | Umeda ........................ 347/10 |

FOREIGN PATENT DOCUMENTS

| | | |
|---|---|---|
| JP | 08-316233 | 11/1996 |
| JP | 10-223755 | 8/1998 |
| JP | 10-229084 | 8/1998 |
| JP | 11-330075 | 11/1999 |
| JP | 2000-195954 | 7/2000 |
| JP | 2000-208443 | 7/2000 |
| JP | 2000-252357 | 9/2000 |
| JP | 2001-358215 A | 12/2001 |
| JP | 2002-043419 | 2/2002 |
| JP | 2002-075994 | 3/2002 |
| JP | 2002-110788 | 4/2002 |
| JP | 2002-231723 | 8/2002 |
| JP | 2002-353306 | 12/2002 |
| JP | 2003-297919 | 10/2003 |
| WO | WO 00/48241 A1 | 8/2000 |

* cited by examiner

SEMICONDUCTOR DEVICE INCLUDING A BARRIER METAL FILM

This application is the U.S. National Phase under 35 U.S.C. §371 of International Application No. PCT/JP2005/009268, filed May 20, 2005, which in turn claims the benefit of Japanese Application No. 2004-165361, filed Jun. 3, 2004, the disclosures of which Applications are incorporated by reference herein in their entirety.

TECHNICAL FIELD

The present invention relates to a semiconductor device including a metal interconnect and a method for fabricating the semiconductor device, and more particularly relates to a barrier metal film and a method for forming the barrier metal film.

BACKGROUND ART

In recent years, as the feature size of semiconductor integrated circuit devices (which will be hereinafter referred to as "semiconductor devices") becomes smaller, a combination of a copper interconnect and an insulation film having a low dielectric constant, i.e., a so-called low-k film has been adopted as a multi-layer interconnect of a semiconductor device. With use of such a multi-layer interconnect, RC delay and power consumption can be reduced. Furthermore, to increase the degree of integration, function and operation speed of a semiconductor device, use of a low-k film having an even lower dielectric constant than that of those presently used is examined.

A copper interconnect is usually formed using a damascene technique. Damascene techniques include a single damascene technique in which an interconnect and a via plug are alternately formed and a dual damascene technique in which an interconnect and a via plug are simultaneously formed.

Hereinafter, a method for forming a multi-layer interconnect by a damascene technique will be described with reference to FIGS. 11(a) and 11(b).

As shown in FIG. 11(a), a first insulation film 102 is formed on a silicon substrate 101 and then a first copper interconnect 104 which is a copper interconnect of a lower layer including a first barrier metal film 103 is formed in the first insulation film 102. On the silicon substrate 101, a transistor and the like (not shown) are formed. Subsequently, a dielectric barrier film 105 for preventing diffusion of copper and a second insulation film 106 are formed in this order over the first insulation film 102 and the first copper interconnect 104. Thus, an insulation layer including the diffusion film 105 and the second insulation film 106 is obtained.

Next, a via hole 106a is formed in the dielectric barrier film 105 and the second insulation film 106 and an interconnect trench 106b is formed in the second insulation film 106. Thus, a recess portion 106c including the via hole 106a and the interconnect trench 106b is obtained. The via hole 106a and the interconnect trench 106b are formed by process steps of forming a dual damascene interconnect trench (i.e., the recess portion 106c including the via hold 106a and the interconnect trench 106b) using known lithography, etching, ashing and cleaning. In general, a method in which after formation of the via hole 106a, the interconnect trench (trench) 106 is formed has widely used (see, for example, Patent Reference 1).

Next, a second barrier metal 107 is formed so as to cover surfaces of the recess portion 106c using physical vapor deposition (PVD) or like film formation method.

Next, on the second barrier metal film 107, a copper seed layer is formed by physical vapor deposition and then a copper film is formed by copper electroplating using the copper seed layer as a seed so as to fill the recess portion 106c and cover an entire surface of the second insulation film 106. Subsequently, parts of the copper film and the second barrier metal film 107 located on the second insulation film, except for parts thereof located inside the recess portion 106c, are removed by chemical mechanical polishing (CMP) to form a second interconnect 108 including a via plug. Note that the second copper interconnect 108 may be an interconnect, a via plug, or a combination of an interconnect and a via plug. A multi-layer interconnect can be formed by repetition of a series of the process steps described above.

Materials used for the second insulation film 106 and the second barrier metal film 107 will be described with reference to FIG. 11(b).

As the dielectric barrier film 105, a silicon nitride film, a silicon nitride carbide film, a silicon carbide oxide film or the like is used. The copper dielectric barrier film 105 has the function of preventing diffusion of copper forming the first interconnect 104 which is a lower layer into the second insulation film 106.

As the second insulation film 106, a silicon oxide film, a fluorine-doped silicon oxide film, a silicon oxide carbide film, or an insulation film formed of an organic film is used. That is, the second insulation film 106 may be a film selected from the group consisting of the films shown in FIG. 11(b) (note that in FIG. 11(b), the case where the second barrier metal film 107 is a metal nitride film is shown). Each of the films may be a film formed by chemical vapor deposition or a SOD (spin on dielectric) film formed by spin coating.

In general, copper is easily diffused in an insulation film such as silicon oxide film by heat or an electric field. This tends to be a cause of deterioration of transistor characteristics. Moreover, copper has poor adhesion with an insulation film. Therefore, in forming a copper interconnect, a method in which a barrier metal film of a tantalum film or a tantalum nitride film is formed between copper and an insulation film to prevent diffusion of copper into the insulation film and also to improve adhesion between the insulation film and copper has been proposed (see, for example, Patent Reference 2). A tantalum film or a tantalum nitride film is used as a single layer or a lamination layer structure.

However, for example, in the above-described example, when a refractory metal such as tantalum is used as the second barrier metal film 107, adhesion between the second insulation film 106 in which the recess portion 106c is formed and the refractory metal film is poor. To cope with the problem of such poor adhesion, for example, if a tantalum film is used as the second barrier metal film 107, a tantalum nitride film is formed between the second barrier metal film 107 made of a tantalum film and the second insulation film 106 to improve poor adhesion. But, in this manner, sufficient adhesion is still not obtained.

Moreover, when a tantalum film is used as the second barrier metal film 107, the tantalum film is oxidized in forming copper by electroplating, so that a high resistance tantalum oxide film is formed. For this reason, increase in interconnect resistance can not be avoided.

Moreover, when a tantalum nitride film is used as the second barrier metal film 107, the tantalum nitride film is not oxidized. However, a tantalum film has a high resistance and adhesion with copper is poor.

Furthermore, when a titanium film or a titanium nitride film is used as the second barrier metal film 107, the same problems arise as when a tantalum film or a tantalum nitride film is used.

In view of the above-described problems, a metal such as ruthenium and iridium which itself or whose oxide has a low resistance is used as the second barrier metal film 107 to achieve reduction in resistance of the second barrier metal film 107 (see, for example, Patent Reference 3 and Patent Reference 4), and this technique has attracted interest. In general, such metals are formed by atomic layer deposition or chemical vapor deposition.

(Patent Reference 1) Japanese Laid-Open Publication No. 10-223755

(Patent Reference 2) Japanese Laid-Open Publication No. 2002-43419

(Patent Reference 3) Japanese Patent Publication No. 3409831

(Patent Reference 4) Japanese Laid-Open Publication No. 2002-75994

DISCLOSURE OF INVENTION

Problems that the Invention is to Solve

However, when a refractory metal film such as tantalum and ruthenium is used as a barrier metal film, the problem of poor adhesion between an insulation film formed in which a recess portion for a damascene interconnect and the barrier metal film of a refractory metal film arises. Such poor adhesion between the insulation film and the barrier metal film can be improved by forming a metal nitride film between the barrier metal film of a refractory metal and the insulation film, compared to the case where a barrier metal film of a refractory metal film is formed directly on the insulation film. But, another problem of increase in the resistance of the barrier metal arises.

In view of the above described problems, it is therefore an object of the present invention to provide a semiconductor device including a barrier metal film with a low resistance and excellent adhesion between an insulation film and an interconnect and a method for fabricating the semiconductor device.

Means of Solving the Problems

To achieve the above-described object, a first semiconductor device according to a present invention is characterized in that the semiconductor device includes: an insulation film formed on a substrate; a buried metal interconnect formed in the insulation film; and a barrier metal film formed between the insulation film and the metal interconnect, and the barrier metal film is a metal compound film, and the metal compound film contains at least one of elements forming the insulation film.

In the first semiconductor device, a common element of the metal compound film and the insulation film exists at an interface between the metal compound film and the insulation film, so that adhesion between the metal compound film and the insulation film is remarkably improved, compared to the case where the common element does not exist at the interface between the metal compound film and the insulation film. Therefore, a highly reliable semiconductor device including a multi-layer interconnect with excellent adhesion can be achieved.

To achieve the above-described object, a second semiconductor device according to the present invention is characterized in that the semiconductor device includes: an insulation film formed on a substrate; a buried metal interconnect formed in the insulation film; and a barrier metal film formed between the insulation film and the metal interconnect, the barrier metal film is formed of a metal compound film provided so as to be in contact with the insulation film and a film including one or more metal-containing layers and formed on the metal compound film, and the metal compound film contains at least one of elements forming the insulation film.

In the second semiconductor device, a common element of the metal compound film and the insulation film exists at an interface between the metal compound film and the insulation film, so that adhesion between the metal compound film and the insulation film is remarkably improved, compared to the case where the common element does not exist at the interface between the metal compound film and the insulation film. Moreover, the barrier metal film includes the metal compound film and the film including one or more metal-containing layers and formed on the metal compound film. Thus, an overall resistance of the barrier metal film can be reduced. Therefore, a highly reliable semiconductor device including a multi-layer interconnect with a low resistance and excellent adhesion can be achieved.

In the second semiconductor device of the present invention, it is preferable that the film including one or more metal-containing layers is formed of a metal film, a metal compound film or a multi-layer film including a combination of selected ones of the metal film and/or the metal compound film.

Thus, a low resistance barrier metal film can be formed and adhesion in a metal lamination film can be improved. Therefore, a highly reliable semiconductor device including a multi-layer interconnect with a low resistance and excellent adhesion can be achieved.

In each of the first and second semiconductor devices of the present invention, it is preferable that the metal compound film is a metal nitride film, and the insulation film contains nitrogen.

Thus, nitrogen which is a common element of the metal compound film and the insulation film exists at an interface between the metal compound film and the insulation film, so that adhesion between the metal compound film and the insulation film is remarkably improved, compared to the case where the common element does not exist at the interface between the metal compound film and the insulation film. Therefore, a highly reliable semiconductor device including a multi-layer interconnect with a low resistance and excellent adhesion can be achieved.

In each of the first and second semiconductor devices of the present invention, it is preferable that the metal compound film is a metal oxide film, and the insulation film contains oxygen.

Thus, oxygen which is a common element of the metal compound film and the insulation film exists at an interface between the metal compound film and the insulation film, so that adhesion between the metal compound film and the insulation film is remarkably improved, compared to the case where the common element does not exist at the interface between the metal compound film and the insulation film. Therefore, a highly reliable semiconductor device including a multi-layer interconnect with a low resistance and excellent adhesion can be achieved.

In each of the first and second semiconductor devices of the present invention, it is preferable that the metal compound film is a metal carbide film, and the insulation film contains carbon.

Thus, carbon which is a common element of the metal compound film and the insulation film exists at an interface between the metal compound film and the insulation film, so that adhesion between the metal compound film and the insulation film is remarkably improved, compared to the case where the common element does not exist at the interface between the metal compound film and the insulation film. Therefore, a highly reliable semiconductor device including a multi-layer interconnect with a low resistance and excellent adhesion can be achieved.

In each of the first and second semiconductor devices, it is preferable that the metal compound film is a metal silicide film, and the insulation film contains silicon.

Thus, silicon which is a common element of the metal compound film and the insulation film exists at an interface between the metal compound film and the insulation film, so that adhesion between the metal compound film and the insulation film is remarkably improved, compared to the case where the common element does not exist at the interface between the metal compound film and the insulation film. Therefore, a highly reliable semiconductor device including a multi-layer interconnect with a low resistance and excellent adhesion can be achieved.

In each of the first and second semiconductor devices, it is preferable that a metal forming the metal compound film is a refractory metal.

Thus, in the process step of further forming an interconnect of an upper layer after formation of the buried metal interconnect, even when heat of about 400° C. is applied, alternation of the metal compound film can be prevented. Therefore, a highly reliable semiconductor device can be achieved.

In each of the first and second semiconductor devices, it is preferable that the metal interconnect is formed of copper or a copper alloy.

Thus, a low cost, highly reliable and high performance semiconductor device including a multi-layer interconnect with a low resistance can be achieved.

To achieve the above-described object, a third semiconductor device according to the present invention is characterized in that the semiconductor device includes: an insulation film formed on a substrate; a buried metal interconnect formed in the insulation film; and a barrier metal film formed between the insulation film and the metal interconnect, the barrier metal film is formed of a metal compound film of a metal silicide film or a metal carbide film provided so as to be in contact with the insulation film, and the insulation film contains a IV-group element.

In the third semiconductor device, each of the metal compound film and the insulation film includes an element having a tetravalent electron orbit and a covalent bond tends to be formed at an interface between the metal compound film and the insulation film. Thus, adhesion between the metal compound film and the insulation is remarkably increased. Therefore, a highly reliable semiconductor device including a multi-layer interconnect with excellent adhesion can be achieved.

To achieve the above-described object, a fourth semiconductor device according to the present invention is characterized in that the semiconductor device includes: an insulation film formed on a substrate; a buried metal interconnect formed in the insulation film; and a barrier metal film formed between the insulation film and the metal interconnect, the barrier metal film is formed of a metal compound film of a metal silicide film or a metal carbide film provided so as to be in contact with the insulation film and a film including one or more metal-containing layers formed on the metal compound film, and the insulation film contains a IV-group element.

In the fourth semiconductor device, each of the metal compound film and the insulation film includes an element having a tetravalent electron orbit and a covalent bond tends to be formed at an interface between the metal compound film and the insulation film, so that adhesion between the metal compound film and the insulation is remarkably increased. Moreover, the barrier metal film includes the metal compound film and the film including one or more metal-containing layers and formed on the metal compound film. Thus, an overall resistance of the barrier metal film can be reduced. Therefore, a highly reliable semiconductor device including a multi-layer interconnect with excellent adhesion can be achieved.

In the fourth semiconductor device of the present invention, it is preferable that the film including one or more metal-containing layers is formed of a metal film, a metal compound film or a multi-layer film including a combination of selected ones of the metal film and/or the metal compound film.

Thus, a low resistance barrier metal film can be formed and adhesion between films in a metal lamination film can be improved. Therefore, a highly reliable semiconductor device including a multi-layer interconnect with a low resistance and excellent adhesion can be achieved.

In each of the third and fourth semiconductor devices, it is preferable that a metal forming the metal compound film is a refractory metal.

Thus, in the process step of further forming an interconnect of an upper layer after formation of the buried metal interconnect, even when heat of about 400° C. is applied, alternation of the metal compound film can be prevented. Therefore, a highly reliable semiconductor device can be achieved.

In each of the third and fourth embodiments of the present invention, it is preferable that the metal interconnect is formed of copper or a copper alloy.

Thus, a low cost, highly reliable and high performance semiconductor device including a multi-layer interconnect with a low resistance can be achieved.

A fifth semiconductor device according to the present invention is characterized in that the semiconductor device includes: a first insulation film formed on a substrate; a buried metal interconnect formed in the first insulation film; a barrier metal film formed between the first insulation film and the metal interconnect, a second insulation film is formed between the first insulation film and the barrier metal film, and the barrier metal film is a metal compound film, and the metal compound film contains at least one of elements forming the second insulation film.

In the fifth semiconductor device of the present invention, a common element of the metal compound film and the second insulation film exists at an interface between the metal compound film and the second insulation film, so that adhesion between the metal compound film and the second insulation film is remarkably improved, compared to the case where the common element does not exist at the interface between the metal compound film and the second insulation film. Moreover, the second insulation film is formed on the first insulation film, so that adhesion between the insulation films is higher than adhesion between an insulation film and a metal film or a metal compound film. Accordingly, the degree of freedom of selection of the second insulation film for the purpose of improving adhesion between the metal compound film and the second insulation film is increased. Due to this, semiconductor device structure designing can be facilitated. In this manner, overall adhesion from the insulation film formed on the substrate through the metal interconnect is largely improved. Therefore, a highly reliable semiconductor device including a multi-layer interconnect with excellent adhesion can be achieved.

In the fifth semiconductor device, it is preferable that a film including one or more metal-containing layers is further formed between the metal compound film and the metal interconnect.

Thus, the barrier metal film includes the film including the metal compound film and the film including one or more metal-containing layers and formed on the metal compound film, so that an overall resistance of the barrier metal film can be reduced. Therefore, a highly reliable semiconductor device including a multi-layer interconnect with a low resistance and excellent adhesion can be achieved.

In the fifth embodiment of the present invention, it is preferable that the film including one or more metal-containing layers is formed of a metal film, a metal compound film or a multi-layer film including a combination of selected ones of the metal film and/or the metal compound film.

Thus, a low resistance barrier metal film can be formed and adhesion between films in a metal lamination film can be improved. Therefore, a highly reliable semiconductor device including a multi-layer interconnect with a low resistance and excellent adhesion can be achieved.

In the fifth semiconductor device of the present invention, it is preferable that the metal compound film is a metal nitride film, and the second insulation film contains nitrogen.

Thus, nitrogen which is a common element of the metal compound film and the second insulation film exists at an interface between the metal compound film and the second insulation film, so that adhesion between the metal compound film and the second insulation film is remarkably improved, compared to the case where the common element does not exist at the interface between the metal compound film and the second insulation film. Therefore, a highly reliable semiconductor device including a multi-layer interconnect with a low resistance and excellent adhesion can be achieved.

In the fifth semiconductor device of the present invention, the metal compound film is a metal oxide film, and the second insulation film contains oxygen.

Thus, oxygen which is a common element of the metal compound film and the second insulation film exists at an interface between the metal compound film and the second insulation film, so that adhesion between the metal compound film and the second insulation film is remarkably improved, compared to the case where the common element does not exist at the interface between the metal compound film and the second insulation film. Therefore, a highly reliable semiconductor device including a multi-layer interconnect with a low resistance and excellent adhesion can be achieved.

In the fifth semiconductor device of the present invention, it is preferable that the metal compound film is a metal carbide film, and the second insulation film contains carbon.

Thus, carbon which is a common element of the metal compound film and the second insulation film exists at an interface between the metal compound film and the second insulation film, so that adhesion between the metal compound film and the second insulation film is remarkably improved, compared to the case where the common element does not exist at the interface between the metal compound film and the second insulation film. Therefore, a highly reliable semiconductor device including a multi-layer interconnect with a low resistance and excellent adhesion can be achieved.

In the fifth semiconductor device of the present invention, it is preferable that the metal compound film is a metal silicide film, and the second insulation film contains silicon.

Thus, silicon which is a common element of the metal compound film and the second insulation film exists at an interface between the metal compound film and the second insulation film, so that adhesion between the metal compound film and the second insulation film is remarkably improved, compared to the case where the common element does not exist at the interface between the metal compound film and the second insulation film. Therefore, a highly reliable semiconductor device including a multi-layer interconnect with a low resistance and excellent adhesion can be achieved.

In the fifth semiconductor device of the preset invention, it is preferable that a metal forming the metal compound film is a refractory metal.

Thus, in the process step of further forming an interconnect of an upper layer after formation of the buried metal interconnect, even when heat of about 400° C. is applied, alternation of the metal compound film can be prevented. Therefore, a highly reliable semiconductor device can be achieved.

In the fifth semiconductor device of the present invention, it is preferable that the metal interconnect is formed of copper or a copper alloy.

Thus, a low cost, highly reliable and high performance semiconductor device including a multi-layer interconnect with a low resistance can be achieved.

To achieve the above-described object, a sixth semiconductor device according to the present invention is characterized in that the semiconductor device includes: a first insulation film formed on a substrate; a buried metal interconnect formed in the first insulation film; and a barrier metal film formed between the first insulation film and the metal interconnect, a second insulation film is formed between the first insulation film and the barrier metal film; the barrier metal film is formed of a metal compound film of a metal silicide film or a metal carbide film, and the second insulation film contains a IV-group element.

In the sixth semiconductor device, each of the metal compound film and the second insulation film includes an element having a tetravalent electron orbit and a covalent bond tends to be formed at an interface between the metal compound film and the second insulation film. Thus, adhesion between the metal compound film and the second insulation film is remarkably increased. Moreover, the second insulation film is formed on the first insulation film, so that adhesion between the insulation films is higher than adhesion between an insulation film and a metal film or a metal compound film. Accordingly, the degree of freedom of selection of the second insulation film for the purpose of improving adhesion between the metal compound film and the second insulation film is increased. Due to this, semiconductor device structure designing can be facilitated. In this manner, overall adhesion from the insulation film formed on the substrate through the metal interconnect is largely improved. Therefore, a highly reliable semiconductor device including a multi-layer interconnect with excellent adhesion can be achieved.

In the sixth semiconductor device of the present invention, it is preferable that a film including one or more metal-containing layers is further formed between the metal compound film and the metal interconnect.

Thus, the barrier metal film includes the metal compound film and the film including one or more metal-containing layers and formed on the metal compound film, so that an overall resistance of the barrier metal film can be reduced. Therefore, a highly reliable semiconductor device including a multi-layer interconnect with a low resistance and excellent adhesion can be achieved.

In the sixth semiconductor device of the present invention, it is preferable that a metal forming the metal compound film is a refractory metal.

Thus, in the process step of further forming an interconnect of an upper layer after formation of the buried metal interconnect, even when heat of about 400° C. is applied, alternation of the metal compound film can be prevented. Therefore, a highly reliable semiconductor device can be achieved.

In the sixth semiconductor device of the present invention, it is preferable that the metal interconnect is formed of copper or a copper alloy.

Thus, a low cost, highly reliable and high performance semiconductor device including a multi-layer interconnect with a low resistance can be achieved.

To achieve the above-described object, a first method for fabricating a semiconductor device according to the present invention is characterized by including the steps of: forming a recess portion in an insulation film formed on a substrate; forming a barrier metal film of a metal compound film containing at least one of elements forming the insulation film so that the barrier metal film covers at least surfaces of the recess portion; and forming a buried metal interconnect on the barrier metal film so that the buried metal interconnect fills the recess portion.

According to the first semiconductor device fabrication method, a structure in which a common element of a metal compound film and an insulation film exists at an interface between the metal compound film and the insulation film can be achieved, so that adhesion between the metal compound film and the insulation film is remarkably improved, compared to the case where the common element does not exist at the interface between the metal compound film and the insulation film. Therefore, a highly reliable semiconductor device including a multi-layer interconnect with excellent adhesion can be fabricated.

To achieve the above-described object, a second method for fabricating a semiconductor device according to the present invention is characterized by including the steps of: forming a recess portion in a first insulation film formed on a substrate; forming a second insulation film so that the second insulation film covers at least surfaces of the recess portion; forming, on the second insulation film, a metal compound film containing at least one of elements forming the second insulation film; and forming a buried metal interconnect on the metal compound film so that the buried metal interconnect fills the recess portion.

According to the second semiconductor device fabrication method, a structure in which a common element of a metal compound film and a second insulation film exists at an interface between the metal compound film and the second insulation film can be achieved, so that adhesion between the metal compound film and the second insulation film is remarkably improved, compared to the case where the common element does not exist at the interface between the metal compound film and the second insulation film. Moreover, the second insulation film is formed on the first insulation film, so that adhesion between the insulation films is higher than adhesion between an insulation film and a metal film or a metal compound film. Accordingly, the degree of freedom of selection of the second insulation film for the purpose of improving adhesion between the metal compound film and the second insulation film is increased. Due to this, semiconductor device structure designing can be facilitated. In this manner, overall adhesion from the insulation film formed on the substrate through the metal interconnect is largely improved. Therefore, a highly reliable semiconductor device including a multi-layer interconnect with excellent adhesion can be fabricated.

In each of the first and second methods for fabricating a semiconductor device according to the present invention, it is preferable that the step of forming a barrier metal film includes the step of further forming, after formation of the metal compound film, a film including one or more metal-containing layers on the metal compound film to obtain the barrier metal film including the metal compound film and the film including one or more metal-containing layers.

Thus, the barrier metal film includes the metal compound film and the film including one or more metal-containing layers and formed on the metal compound film, so that an overall resistance of the barrier metal film can be reduced. Therefore, a highly reliable semiconductor device including a multi-layer interconnect with a low resistance and excellent adhesion can be fabricated.

In each of the first and second methods for fabricating a semiconductor device according to the present invention, it is preferable that the film including one or more metal-containing layers is a metal film, a metal compound film or a multi-layer film including a combination of selected ones of the metal film and/or the metal compound film.

Thus, a low resistance barrier metal film can be formed and adhesion between films in a metal lamination film can be improved. Therefore, a highly reliable semiconductor device including a multi-layer interconnect with a low resistance and excellent adhesion can be fabricated.

In each of the first and second methods for fabricating a semiconductor device according to the present invention, it is preferable that the metal oxide film is a metal nitride film, and the insulation film formed so as to be adjacent to the metal compound film contains nitrogen.

Thus, nitrogen which is a common element of the metal compound film and the insulation film provided so as to be adjacent to the metal compound film exists at an interface between the metal compound film and the insulation film, so that adhesion between the metal compound film and the insulation film is remarkably improved, compared to the case where the common element does not exist at the interface between the metal compound film and the insulation film. Therefore, a highly reliable semiconductor device including a multi-layer interconnect with a low resistance and excellent adhesion can be fabricated.

In each of the first and second methods for fabricating a semiconductor device according to the present invention, it is preferable that the metal compound film is a metal oxide film, and the insulation film formed so as to be adjacent to the metal compound film contains oxygen.

Thus, oxygen which is a common element of the metal compound film and the insulation film formed so as to be adjacent to the metal compound film exists at an interface between the metal compound film and the insulation film, so that adhesion between the metal compound film and the insulation film is remarkably improved, compared to the case where the common element does not exist at the interface between the metal compound film and the insulation film. Therefore, a highly reliable semiconductor device including a multi-layer interconnect with a low resistance and excellent adhesion can be fabricated.

In each of the first and second methods for fabricating a semiconductor device according to the present invention, it is preferable that the metal compound film is a metal carbide film, and the insulation film formed so as to be adjacent to the metal compound film contains carbon.

Thus, carbon which is a common element of the metal compound film and the insulation film provided so as to be adjacent to the metal compound film exists at an interface between the metal compound film and the insulation film, so that adhesion between the metal compound film and the insulation film is remarkably improved, compared to the case where the common element does not exist at the interface between the metal compound film and the insulation film. Therefore, a highly reliable semiconductor device including a multi-layer interconnect with a low resistance and excellent adhesion can be fabricated.

In each of the first and second methods for fabricating a semiconductor device according to the present invention, it is preferable that the metal compound film is a metal silicide film, and the insulation film formed so as to be adjacent to the metal compound film contains silicon.

Thus, silicon which is a common element of the metal compound film and the insulation film exists at an interface between the metal compound film and the insulation film, so that adhesion between the metal compound film and the insulation film is remarkably improved, compared to the case where the common element does not exist at the interface between the metal compound film and the insulation film. Therefore, a highly reliable semiconductor device including a multi-layer interconnect with a low resistance and excellent adhesion can be fabricated.

In each of the first and second methods for fabricating a semiconductor device according to the present invention, it is preferable that a metal forming the metal compound film is a refractory metal.

Thus, in the process step of further forming an interconnect of an upper layer after formation of the buried metal interconnect, even when heat of about 400° C. is applied, alternation of the metal compound film can be prevented. Therefore, a highly reliable semiconductor device can be fabricated.

In each of the first and second methods for fabricating a semiconductor device according to the present invention, it is preferable that the metal interconnect is formed of copper or a copper alloy.

Thus, a low cost, highly reliable and high performance semiconductor device including a multi-layer interconnect with a low resistance can be fabricated.

A third method for fabricating a semiconductor device according to the present invention is characterized by including the steps of: forming a recess portion in an insulation film formed on a substrate and containing a IV-group element; forming a barrier metal film including a metal compound film of a metal silicide film or a metal carbide film so that the barrier metal film covers at least surfaces of the recess portion; and forming a buried metal interconnect on the barrier metal film so that the buried metal interconnect fills the recess portion.

According to the third semiconductor fabrication method, each of the metal compound film and the insulation film includes an element having a tetravalent electron orbit and a covalent bond tends to be formed at an interface between the metal compound film and the insulation film. Thus, adhesion between the metal compound film and the insulation is remarkably increased. Therefore, a highly reliable semiconductor device including a multi-layer interconnect with excellent adhesion can be fabricated.

A fourth method for fabricating a semiconductor device according to the present invention is characterized by including: forming a recess portion in a first insulation film formed on a substrate; forming a second insulation film including a IV-group element so that the second insulation film covers at least surfaces of the recess portion; forming, on the second insulation film, a barrier metal film including a metal compound film of a metal silicide film or a metal carbide film; and forming a buried metal interconnect on the barrier metal film so that the metal interconnect fills the recess portion.

According to the fourth semiconductor device fabrication method, each of the metal compound film and the second insulation film includes an element having a tetravalent electron orbit and a covalent bond tends to be formed at an interface between the metal compound film and the second insulation film. Moreover, the second insulation film is formed on the first insulation film, so that adhesion between the insulation films is higher than adhesion between an insulation film and a metal film or a metal compound film. Accordingly, the degree of freedom of selection of the second insulation film for the purpose of improving adhesion between the metal compound film and the second insulation film is increased. Due to this, semiconductor device structure designing can be facilitated. In this manner, overall adhesion from the insulation film formed on the substrate through the metal interconnect is largely improved. Therefore, a highly reliable semiconductor device including a multi-layer interconnect with excellent adhesion can be fabricated.

In each of the third and fourth methods for fabricating a semiconductor device according to the present invention, it is preferable that the step of forming the barrier metal film includes the step of forming, after formation of the metal compound film, a film including one or more metal-containing layers on the metal compound film to obtain the barrier metal film including the metal compound film and the film including one or more metal-containing layers.

Thus, the barrier metal film includes the metal compound film and the film including one or more metal-containing layers and formed on the metal compound film, so that an overall resistance of the barrier metal film can be reduced. Therefore, a highly reliable semiconductor device including a multi-layer interconnect with a low resistance and excellent adhesion can be achieved.

In each of the third and fourth semiconductor fabrication methods according to the present invention, it is preferable that a metal forming the metal compound film is a refractory metal.

Thus, in the process step of further forming an interconnect of an upper layer after formation of the buried metal interconnect, even when heat of about 400° C. is applied, alternation of the metal compound film can be prevented. Therefore, a highly reliable semiconductor device can be achieved.

In each of the third and fourth semiconductor fabrication methods according to the present invention, it is preferable that the metal interconnect is formed of copper or a copper alloy.

Thus, a low cost, highly reliable and high performance semiconductor device including a multi-layer interconnect with a low resistance can be achieved.

Effects of the Invention

In the first semiconductor device of the present invention, a common element of the metal compound film and the insulation film exists at an interface between the metal compound film and the insulation film, so that adhesion between the metal compound film and the insulation film is remarkably improved, compared to the case where the common element does not exist at the interface between the metal compound film and the insulation film. Therefore, a highly reliable semiconductor device including a multi-layer interconnect with excellent adhesion can be achieved.

In the second semiconductor device of the present invention, a common element of the metal compound film and the insulation film exists at an interface between the metal compound film and the insulation film, so that adhesion between the metal compound film and the insulation film is remarkably improved. Moreover, the barrier metal film includes the metal compound film and the film including one or more metal-containing layers and formed on the metal compound film. Thus, an overall resistance of the barrier metal film can be reduced. Therefore, a highly reliable semiconductor device including a multi-layer interconnect with a low resistance and excellent adhesion can be achieved.

In the third semiconductor device of the present invention, each of the metal compound film and the insulation film includes an element having a tetravalent electron orbit and a covalent bond tends to be formed at an interface between the metal compound film and the insulation film. Thus, adhesion between the metal compound film and the insulation is remarkably increased. Therefore, a highly reliable semiconductor device including a multi-layer interconnect with excellent adhesion can be achieved.

In the fourth semiconductor device of the present invention, each of the metal compound film and the insulation film includes an element having a tetravalent electron orbit and a covalent bond tends to be formed at an interface between the metal compound film and the insulation film, so that adhesion between the metal compound film and the insulation is remarkably increased. Moreover, the barrier metal film includes the metal compound film and the film including one or more metal-containing layers and formed on the metal compound film. Thus, an overall resistance of the barrier metal film can be reduced. Therefore, a highly reliable semiconductor device including a multi-layer interconnect with excellent adhesion can be achieved.

In the fifth semiconductor device of the present invention, a common element of the metal compound film and the second insulation film exists at an interface between the metal compound film and the second insulation film, so that adhesion between the metal compound film and the second insulation film is remarkably improved, compared to the case where the common element does not exist at the interface between the metal compound film and the second insulation film. Moreover, the second insulation film is formed on the first insulation film, so that adhesion between the insulation films is higher than adhesion between an insulation film and a metal film or a metal compound film. Accordingly, the degree of freedom of selection of the second insulation film for the purpose of improving adhesion between the metal compound film and the second insulation film is increased. Due to this, semiconductor device structure designing can be facilitated. In this manner, overall adhesion from the insulation film formed on the substrate through the metal interconnect is largely improved. Therefore, a highly reliable semiconductor device including a multi-layer interconnect with excellent adhesion can be achieved.

In the sixth semiconductor device of the present invention, each of the metal compound film and the second insulation film includes an element having a tetravalent electron orbit and a covalent bond tends to be formed at an interface between the metal compound film and the second insulation film. Thus, adhesion between the metal compound film and the second insulation film is remarkably increased. Moreover, the second insulation film is formed on the first insulation film, so that adhesion between the insulation films is higher than adhesion between an insulation film and a metal film or a metal compound film. Accordingly, the degree of freedom of selection of the second insulation film for the purpose of improving adhesion between the metal compound film and the second insulation film is increased. Due to this, semiconductor device structure designing can be facilitated. In this manner, overall adhesion from the insulation film formed on the substrate through the metal interconnect is largely improved. Therefore, a highly reliable semiconductor device including a multi-layer interconnect with excellent adhesion can be achieved.

According to the first inventive semiconductor device fabrication method, a structure in which a common element of a metal compound film and an insulation film exists at an interface between the metal compound film and the insulation film can be achieved, so that adhesion between the metal compound film and the insulation film is remarkably improved, compared to the case where the common element does not exist at the interface between the metal compound film and the insulation film. Therefore, a highly reliable semiconductor device including a multi-layer interconnect with excellent adhesion can be fabricated.

According to the second inventive semiconductor device fabrication method, a structure in which a common element of a metal compound film and a second insulation film exists at an interface between the metal compound film and the second insulation film can be achieved, so that adhesion between the metal compound film and the second insulation film is remarkably improved, compared to the case where the common element does not exist at the interface between the metal compound film and the second insulation film. Moreover, the second insulation film is formed on the first insulation film, so that adhesion between the insulation films is higher than adhesion between an insulation film and a metal film or a metal compound film. Accordingly, the degree of freedom of selection of the second insulation film for the purpose of improving adhesion between the metal compound film and the second insulation film is increased. Due to this, semiconductor device structure designing can be facilitated. In this manner, overall adhesion from the insulation film formed on the substrate through the metal interconnect is largely improved. Therefore, a highly reliable semiconductor device including a multi-layer interconnect with excellent adhesion can be fabricated.

According to the third inventive semiconductor device fabrication method, each of the metal compound film and the insulation film includes an element having a tetravalent electron orbit and a covalent bond tends to be formed at an interface between the metal compound film and the insulation film. Thus, adhesion between the metal compound film and the insulation is remarkably increased. Therefore, a highly reliable semiconductor device including a multi-layer interconnect with excellent adhesion can be fabricated.

According to the fourth inventive semiconductor device fabrication method, each of the metal compound film and the second insulation film includes an element having a tetravalent electron orbit and a covalent bond tends to be formed at an interface between the metal compound film and the second insulation film. Moreover, the second insulation film is formed on the first insulation film, so that adhesion between the insulation films is higher than adhesion between an insulation film and a metal film or a metal compound film. Accordingly, the degree of freedom of selection of the second insulation film for the purpose of improving adhesion between the metal compound film and the second insulation film is increased. Due to this, semiconductor device structure designing can be facilitated. In this manner, overall adhesion from the insulation film formed on the substrate through the metal interconnect is largely improved. Therefore, a highly reliable semiconductor device including a multi-layer interconnect with excellent adhesion can be fabricated.

BEST MODE FOR CARRYING OUT THE INVENTION

First Embodiment

Hereinafter, a semiconductor device according to a first embodiment of the present invention will be described with reference to FIGS. 1(a) and 1(b).

Figure 1A:
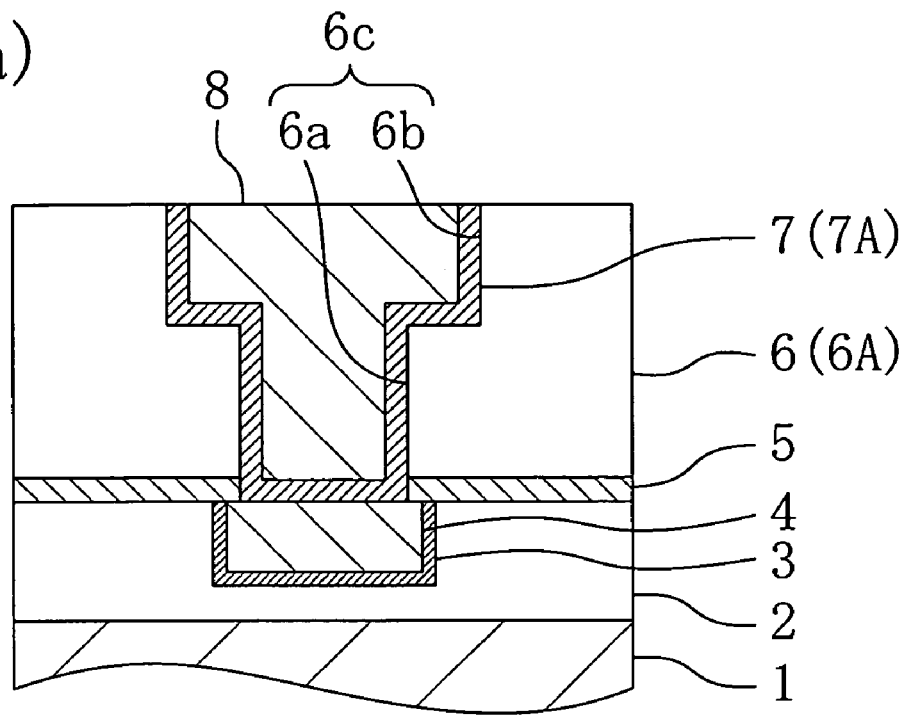
FIG. 1(a) is a cross-sectional view illustrating relevant part of a structure of a semiconductor device according to a first embodiment of the present invention.

FIG. 1(a) is a cross-sectional view illustrating relevant part of a structure of the semiconductor device according to the first embodiment of the present invention.

As shown in FIG. 1(a), a first insulation film 2 is formed on a silicon substrate 1. A first interconnect 4 which is a copper interconnect of a lower layer including a first barrier metal film 3 is formed in the first insulation film 2. On the silicon substrate 1, a transistor and the like (not shown) are formed. A dielectric barrier film 5 for preventing diffusion of copper and a second insulation film 6 are formed in this order over the first insulation film 2 and the first interconnect 4. Thus, an insulating layer including the dielectric barrier film 5 and the second insulation film 6 is formed.

A via hole 6a is formed in the dielectric barrier film 5 and the second insulation film 6 so as to reach the first interconnect 4, and an interconnect trench 6b is formed in the second insulating film 6 so as to communicate with the via hole 6a. Thus, a recess portion 6c can be formed by process steps for forming a dual damascene interconnect trench (i.e., the recess portion 6c including the via hole 6a and the interconnect trench 6b) using known lithography, etching, ashing and cleaning. In general, a method in which the via hole 6a is formed and then the interconnect trench (trench) 6b is formed has been widely used.

Moreover, a metal compound film 7 as a second barrier metal film is formed on surfaces of the recess portion 6c by physical vapor deposition (PVD) or like film formation method. In this case, the metal compound film 7 is formed in order to prevent diffusion of copper into the second insulation film 6 and also to improve adhesion between a second interconnect 8 which will be described later and the second insulation film 6. Moreover, the metal compound film 7 may be formed by some other method than physical vapor deposition, i.e., atomic layer deposition (ALD), chemical vapor deposition (CVD) or the like.

Furthermore, a copper film is filled in the recess portion 6c to form a second interconnect 8 on the metal compound film 7. The second interconnect 8 is formed in the following manner. First, a copper layer is formed on the metal compound film 7 by physical vapor deposition and then a copper film is formed by copper electroplating using the copper seed layer as a seed so as to fill the recess portion 6c and cover an entire surface of the second insulation film 6. Subsequently, parts of the copper film and the metal compound film 7 located on the second insulation film 6, except for parts thereof located inside the recess portion 6c, are removed by chemical mechanical polishing (CMP). Thus, the second interconnect 8 and a via plug which is part of the second interconnect 8 are simultaneously formed. A multi-layer interconnect is formed by repetition of a series of process steps from formation of the dielectric barrier film 5 to chemical mechanical polishing. In this embodiment, the case where a dual damascene technique is used is described. However, a single damascene technique may be used. In such a case, an interconnect and a via plug which is part of the interconnect are alternately formed.

As the dielectric barrier film 5, a silicon nitride film, a silicon nitride carbide film, a silicon carbide oxide film, a silicon carbide film, or an insulation film such as a lamination film formed of a combination of those films is preferably used. The dielectric barrier film 5 has the function of preventing diffusion of copper of the first interconnect 4 into the second insulation film 6. The second insulation film 6 will be described later.

As a metal forming the metal compound film 7, a refractory metal is preferably used. Thus, in the process step of forming an interconnect of an upper layer after formation of the second interconnect 8, even when heat of about 400° C. is applied, the metal compound film 7 is not altered by the heat treatment. Therefore, a highly reliable semiconductor device can be achieved.

When the metal compound film 7 as a second barrier metal film is incorporated in an actual semiconductor device, the metal compound film 7 is preferably formed so as to have a thickness of about several to 30 nm in a 65 nm generation semiconductor device. In a 45 nm generation semiconductor device, it is expected that the thickness of the second barrier metal film as a whole has to be about 15 nm or less at most. A method for forming the metal compound film 7 is preferably optimized in an arbitrary manner according to its application.

As a material for the second interconnect 8, besides copper, a low resistance metal such as silver, gold or platinum is preferably used. Thus, a low resistance multi-layer interconnect can be formed. It is more preferable that as a material of the second interconnect 8, copper or a copper alloy (i.e., an alloy containing copper as a main component and partially containing some other metal) is used. Thus, a semiconductor device including a low resistance multi-layer interconnect can be achieved at low cost.

Now, features of the semiconductor device of the first embodiment of the present invention will be described.

The semiconductor device of the first embodiment is characterized in that the metal compound film 7 as a second barrier metal film contains at least one of elements forming the second insulation film 6. Thus, a common element of the second insulation film 6 and the metal compound film 7 exists at an interface between the metal compound film 7 and the second insulation film 6, so that adhesion between the metal compound film 7 and the second insulation film 6 is remarkably improved, compared to the case where the common element does not exist at the interface between the metal compound film 7 and the second insulation film 6. Specifically, because of the existence of the common element at the interface between the metal compound film 7 and the second insulation film 6, when the metal compound film 7 is formed on a surface of the second insulation film 6, binding between the metal compound film 7 and the second insulation film 6 at an interface therebetween becomes stronger. Accordingly, there becomes almost seam less at the interface between the metal compound film 7 and the second insulation film 6. Therefore, a highly reliable semiconductor device including a multi-layer interconnect with excellent adhesion can be achieved.

Figure 1B:
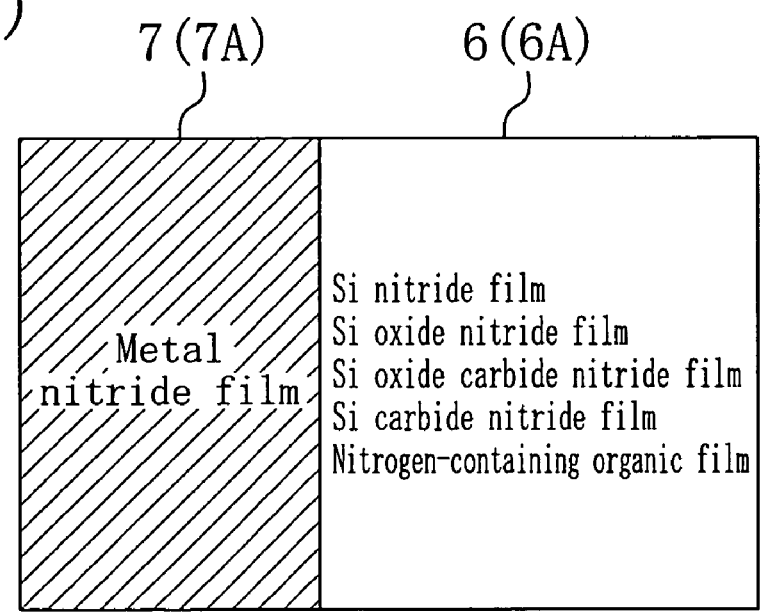
FIG. 1(b) is a view illustrating a structure for a second insulation film and a metal compound film in the semiconductor device of the first embodiment.

In this embodiment, as the second insulation film 6, a second insulation film 6A made of a material selected from the group consisting of materials shown in FIG. 1(b) is preferably used. Specifically, as the second insulation film 6A, a silicon nitride film, a silicon oxide nitride film, a silicon oxide carbide nitride film, a silicon carbide nitride film or an insulation film formed of a nitrogen-containing organic film is preferably used. Each of the films may be a film formed by chemical vapor deposition or a SOD (spin on dielectric) film formed by spin coating.

In this case, as shown in FIG. 1(b), a metal nitride film 7A is preferably used as the metal compound film 7.

Thus, because of the existence of nitrogen, which is the common element, at the interface between the metal nitride film 7A as the metal compound film 7 and the second insulation film 6A as the second insulation film 6, adhesion between the metal compound film 7 and the second insulation film 6 is remarkably improved, compared to the case where the common element does not exist at the interface between the metal compound film 7 and the second insulation film 6.

Thus, a highly reliable semiconductor device including a multi-layer interconnect with higher adhesion than that in the case where a metal film and an insulation film are jointed can be achieved.

Specifically, as a metal of the metal nitride film 7A, titanium (Ti), zirconium (Zr), hafnium (Hf), tantalum (Ta), niobium (Nb), tungsten (W), vanadium (V), molybdenum (Mo), ruthenium (Ru), osmium (Os), rhodium (Rh), iridium (Ir), palladium (Pd) or platinum (Pt) is preferably used.

It is more preferable that as a metal of the metal nitride film 7A, a metal such as titanium (Ti), zirconium (Zr), hafnium (Hf), tantalum (Ta), niobium (Nb) and tungsten (W) may be preferably used. Thus, even when being nitrided, conductivity is not largely lost, so that a low resistance second barrier metal film can be formed.

Even when a metal of the metal nitride film 7A shown in FIG. 1(b) is further oxidized, carbonized, or silicidized, adhesion between a resultant film and the second insulation film 6A containing nitrogen becomes equivalent or according to adhesion of the metal nitride film 7A with the second insulation film 6A.

As has been described, according to the first embodiment of the present invention, a highly reliable semiconductor device including a multi-layer interconnect with excellent adhesion between the metal compound film 7 as the second barrier metal film and the second insulation film 6 can be achieved.

In this embodiment, the case where a dual damascene structure is adopted has been described. However, even in the case where a single damascene structure in which an interconnect and a via plug which is part of the interconnect are formed is adopted, the same effects as those described above can be achieved.

Second Embodiment

Hereinafter, a semiconductor device according to a second embodiment of the present invention will be described with reference to FIGS. 2(a) and 2(b).

Figure 2A:
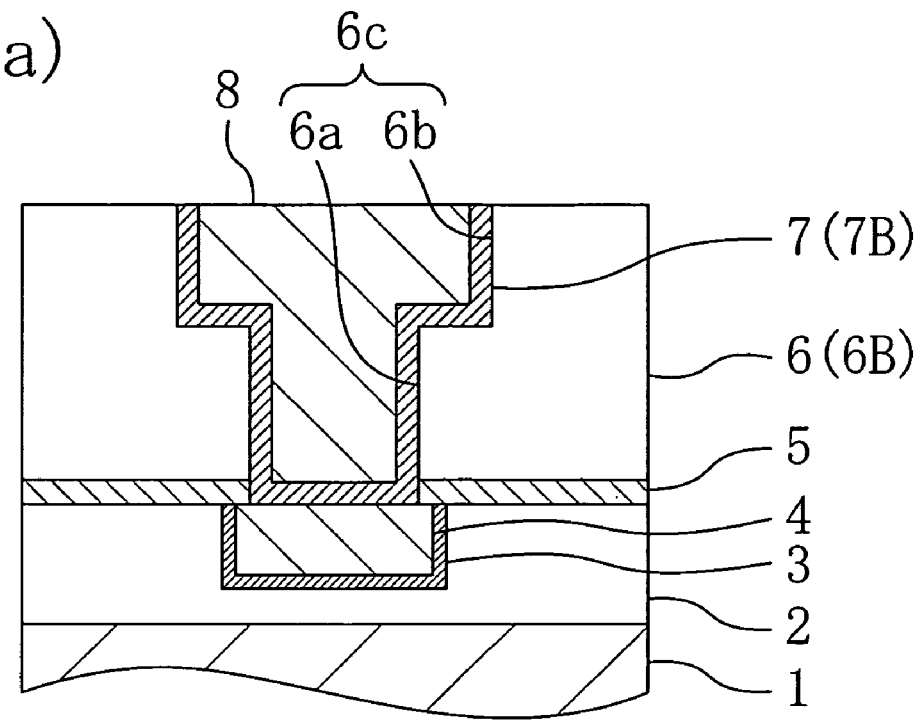
FIG. 2(a) is a cross-sectional view illustrating relevant part of a structure of a semiconductor device according to a second embodiment of the present invention.

FIG. 2(a) is a cross-sectional view illustrating relevant part of a structure of the semiconductor device according to the second embodiment of the present invention. In the second embodiment, the description also shown in the first embodiment is not repeated. Hereinafter, the description will be given focusing on different points from the first embodiment. In FIGS. 2(a) and 2(b), each member also shown in FIGS. 1(a) and 1(b) is identified by the same reference numeral.

The second embodiment is different from the first embodiment in materials used as a second insulation film 6 and a metal compound film 7 and a combination of the materials.

Figure 2B:
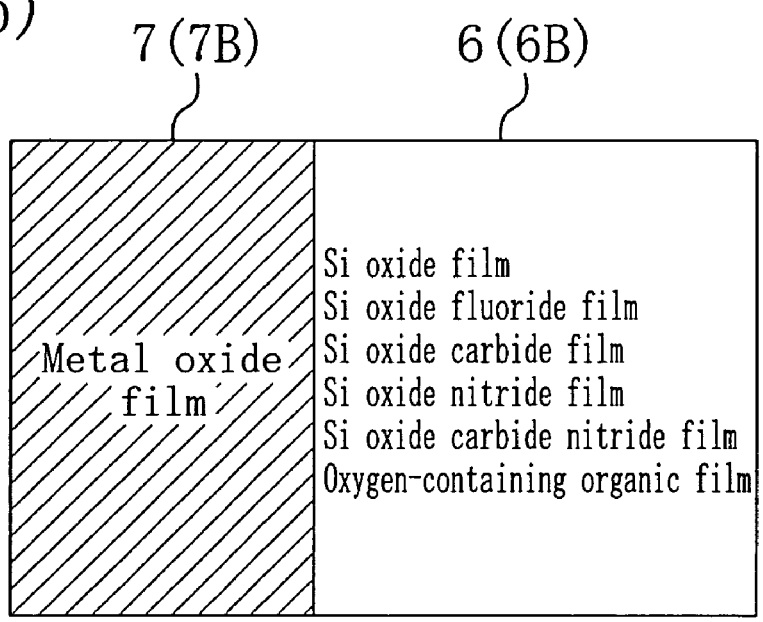
FIG. 2(b) is a view illustrating a structure for a second insulation film and a metal compound film in the semiconductor device of the second embodiment.

Specifically, as shown in FIGS. 2(a) and 2(b), a silicon oxide film, a silicon oxide fluoride film, a silicon oxide carbide film, a silicon oxide nitride film, a silicon oxide carbide nitride film or an insulation film formed of an organic film containing oxygen is used as a second insulation film 6B used in the second embodiment. Each of the films may be a film formed by chemical vapor deposition or a SOD (spin on dielectric) film formed by spin coating.

In such a case, it is preferable that as shown in FIG. 2(b), a metal oxide film 7B is used as a metal compound film 7.

Thus, oxygen which is a common element of the second insulation film 6B and the metal oxide film 7B exists at an interface between the metal oxide film 7B as the metal compound film 7 and the second insulation film 6B as the second insulation film 6. Accordingly, compared to the case where the common element does not exist at the interface between the metal compound film 7 and the second insulation film 6, adhesion between the metal compound film 7 and the second insulation film 6 can be remarkably improved.

Therefore, a highly reliable semiconductor device including a multilayer interconnect with higher adhesion than that in the case where a metal film and an insulation film are jointed can be achieved.

As a metal of the metal oxide film 7B, a metal such as titanium (Ti), zirconium (Zr), hafnium (Hf), tantalum (Ta), niobium (Nb), tungsten (W), vanadium (V), molybdenum (Mo), ruthenium (Ru), osmium (Os), rhodium (Rh), platinum (Pt), iridium (Ir) and palladium (Pd) may be preferably used.

It is more preferable that a metal such as vanadium (V), molybdenum (Mo), ruthenium (Ru), osmium (Os), rhodium (Rh), iridium (Ir), palladium (Pd) and platinum (Pt) is used. Thus, a conductivity of the metal is not lost even when being oxidized. Therefore, a low resistance second barrier metal film can be formed.

Even when a metal of the metal oxide film 7B shown in FIG. 2(b) is further oxidized, carbonized, or silicidized, adhesion between a resultant film and the second insulation film 6B containing oxygen becomes equivalent or according to adhesion of the metal oxide film 7B with the second insulation film 6B.

As has been described, according to the second embodiment of the present invention, a highly reliable semiconductor device including a multi-layer interconnect with excellent adhesion between the metal compound film 7 as the second barrier metal film and the second insulation film 6 can be achieved.

Third Embodiment

Hereinafter, a semiconductor device according to a third embodiment of the present invention will be described with reference to FIGS. 3(a) and 3(b).

Figure 3A:
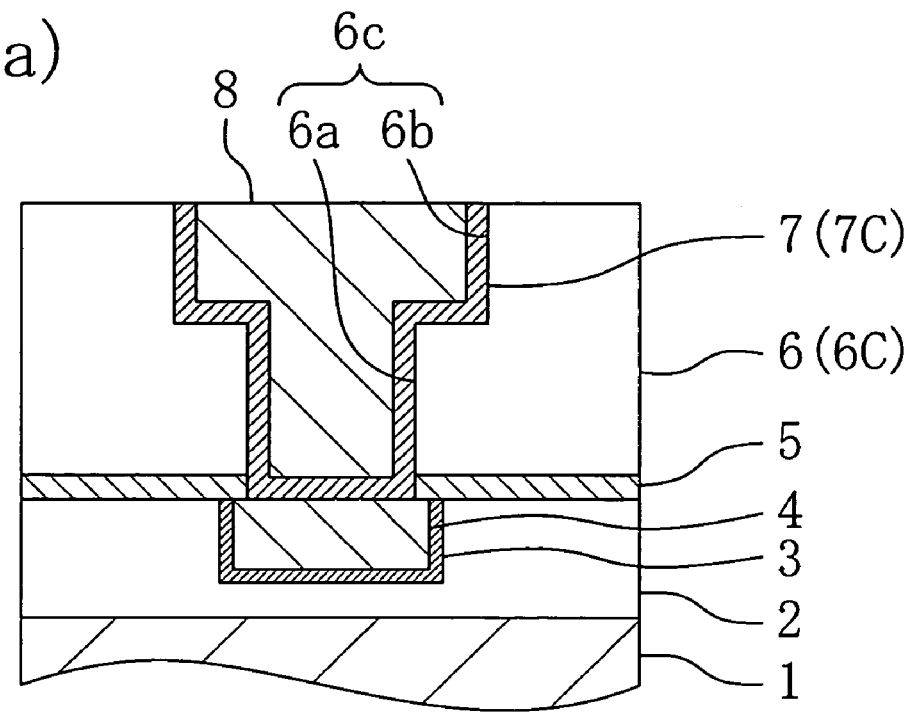
FIG. 3(a) is a cross-sectional view illustrating relevant part of a structure of a semiconductor device according to a third embodiment of the present invention.

FIG. 3(a) is a cross-sectional view illustrating relevant part of a semiconductor device according to the third embodiment of the present invention. In the third embodiment, the description also shown in the first embodiment is not repeated. Hereinafter, the description will be given focusing on different points from the first embodiment. In FIGS. 3(a) and 3(b), each member also shown in FIGS. 1(a) and 1(b) is identified by the same reference numeral.

The third embodiment is different from the first embodiment in materials used as the second insulation film 6 and the metal compound film 7 and a combination of the materials.

Figure 3B:
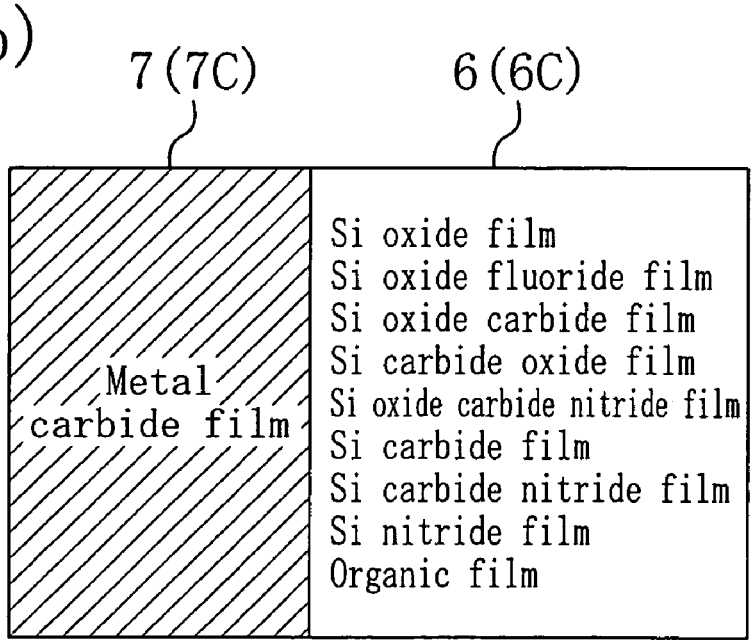
FIG. 3(b) is a view illustrating a structure for a second insulation film and a metal compound film in the semiconductor device of the third embodiment.

Specifically, as shown in FIGS. 3(a) and 3(b), a silicon oxide film, a silicon oxide fluoride film, a silicon oxide carbide film, a silicon carbide oxide film, a silicon oxide carbide nitride film, a silicon carbide film, a silicon carbide nitride film, a silicon nitride film or an insulation film formed of an organic film is used as a second insulation film 6C used in the third embodiment. Each of the films may be a film formed by chemical vapor deposition or a SOD (spin on dielectric) film formed by spin coating.

In such a case, as shown in FIG. 3(b), it is preferable that the metal carbide film 7C is used as the metal compound film 7.

Thus, carbon exists in the metal carbide film 7C. In the second insulation film 6C, silicon exists, except for the case where the second insulation film 6C is formed of an organic film. Carbon and silicon are elements having a tetravalent electron orbit and, unlike other elements, tend to form a covalent bond when a metal film is formed. Accordingly, adhesion between the metal carbide film 7C and the second insulation film 6C is increased.

It is more preferable that when the metal carbide film 7C is used as the metal compound film 7, a silicon oxide carbide film, a silicon carbide oxide film, a silicon oxide carbide nitride film, a silicon carbide film, a silicon carbide nitride film or an organic film is used as the second insulation film 6C.

Thus, besides the above-described factors of improvement of adhesion, carbon which is a common element of the metal carbide film 7C as the metal compound film 7 and the second insulation film 6C as the second insulation film 6 exists at an interface between the metal carbide film 7C and the second insulation film 6C. Accordingly, adhesion between the metal compound film 7 and the second insulation film 6 is remarkably increased, compared to the case where the common element does not exist at the interface between the metal compound film 7 and the second insulation film 6. Moreover, when the second insulation film 6C is formed of an organic film, the organic film contains carbon as a main component and thus carbon which is the common element between the metal compound film 7 and the second insulation film 6 exists at the interface between the metal compound film 7 and the second insulation film 6. Therefore, adhesion between the metal carbide film 7C and the second insulation film 6C is increased.

Thus, a highly reliable semiconductor device including a multi-layer interconnect with higher adhesion than that in the case where a metal film and an insulation film are jointed can be achieved.

As a metal of the metal carbide film 7C, titanium (Ti), zirconium (Zr), hafnium (Hf), tantalum (Ta), niobium (Nb), tungsten (W), vanadium (V), molybdenum (Mo), ruthenium (Ru), osmium (Os), rhodium (Rh), iridium (Ir), palladium (Pd) or platinum (Pt) is preferably used.

It is more preferable that a metal having a low resistivity even when being carbonized is used.

Even when a metal of the metal nitride film 7C shown in FIG. 3(b) is further oxidized, carbonized, or silicidized, adhesion between a resultant film and the second insulation film 6C containing carbon becomes equivalent or according to adhesion of the metal nitride film 7C with the second insulation film 6C.

As has been described, according to the third embodiment of the present invention, a highly reliable semiconductor device including a multi-layer interconnect with excellent adhesion between the metal compound film 7 as the second barrier metal film and the second insulation film 6 can be achieved.

Fourth Embodiment

Hereinafter, a semiconductor device according to a fourth embodiment of the present invention will be described with reference to FIGS. 4(a) and 4(b).

Figure 4A:
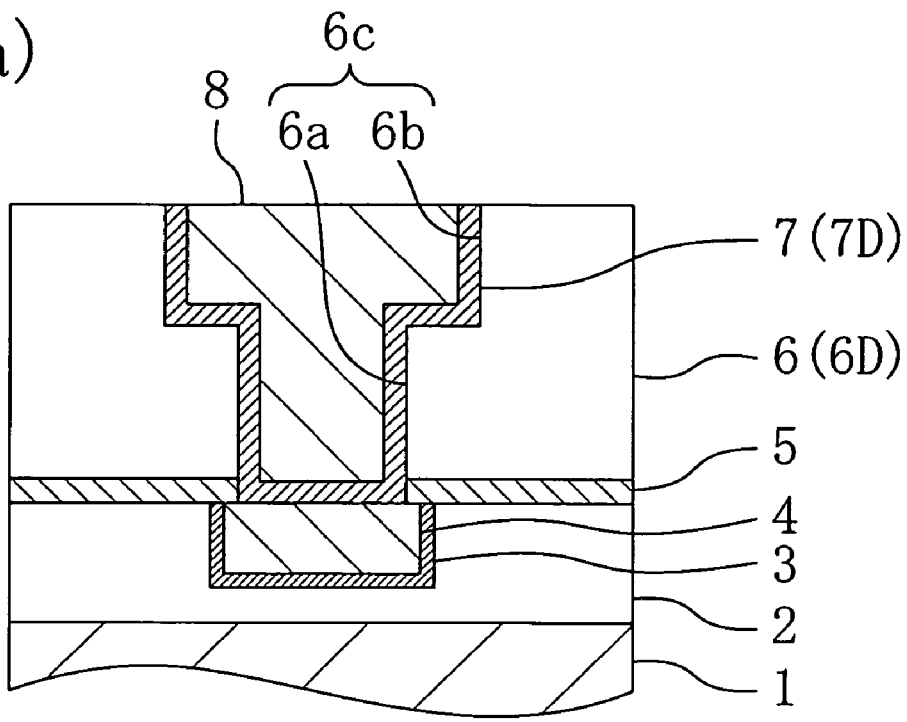
FIG. 4(a) is a cross-sectional view illustrating relevant part of a structure of a semiconductor device according to a fourth embodiment of the present invention.

FIG. 4(a) is a cross-sectional view illustrating relevant part of a semiconductor device according to the fourth embodiment of the present invention. In the fourth embodiment, the description also shown in the first embodiment is not repeated. Hereinafter, the description will be given focusing on different points from the first embodiment. In FIGS. 4(a) and 4(b), each member also shown in FIGS. 1(a) and 1(b) is identified by the same reference numeral.

Figure 4B:
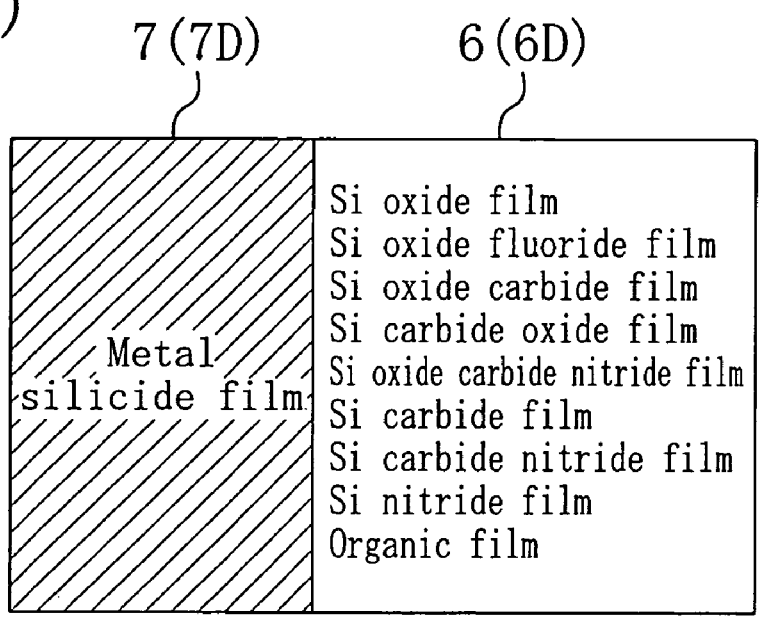
FIG. 4(b) is a view illustrating a structure for a second insulation film and a metal compound film in the semiconductor device of the fourth embodiment.

As shown in FIGS. 4(a) and 4(b), a silicon oxide film, a silicon oxide fluoride film, a silicon oxide carbide film, a silicon carbide oxide film, a silicon oxide carbide nitride film, a silicon carbide film, a silicon carbide nitride film, a silicon nitride film, an insulation film formed of an organic film or an insulation film formed of an organic film containing silicon is used as the second insulation film 6D used in the fourth embodiment. Each of the films may be a film formed by chemical vapor deposition or a SOD (spin on dielectric) film formed by spin coating.

In such a case, as shown in FIG. 4(b), it is preferable that a metal silicide film 7D is used as a metal compound film 7.

Thus, silicon exists in the metal silicide film 7D. In the second insulation film 6D, silicon exists, except for the case where the second insulation film 6D is formed of an organic film (i.e., an insulation film formed of an organic film which does not contain silicon). Accordingly, silicon which is a common element of the metal silicide film 7D as the metal compound film 7 and the second insulation film 6D as the second insulation film 6D exists at an interface between the metal silicide film 7D and the second insulation film 6D. Therefore, adhesion between the metal compound film 7 and the second insulation film 6 is remarkably improved, compared to the case where the common element does not exist at the interface between the metal compound film 7 and the second insulation film 6. Moreover, since silicon atoms tend to form a covalent bond, adhesion between the metal compound film 7 and the second insulation film 6 is further improved. Furthermore, when the second insulation film 6D is formed of an organic film (i.e., an insulation film formed of an organic film which does not contain silicon), the organic film contains carbon as a main component. Carbon and silicon are elements having a tetravalent electron orbit and a covalent bond tends to be formed. Therefore, a highly reliable semiconductor device including a multi-layer interconnect with more excellent adhesion than the case where a metal film and an insulation film are jointed can be achieved.

Moreover, as a metal of the metal silicide film 7D, titanium (Ti), zirconium (Zr), hafnium (Hf), tantalum (Ta), niobium (Nb), tungsten (W), vanadium (V), molybdenum (Mo), ruthenium (Ru), osmium (Os), rhodium (Rh), iridium (Ir), palladium (Pd) or platinum (Pt) is preferably used.

It is more preferable that a metal having a low resistivity even when being silicidized is used.

Even when a metal of the metal nitride film 7D shown in FIG. 4(*b*) is further oxidized, carbonized, or silicidized, adhesion between a resultant film and the second insulation film 6D containing silicon is equivalent or according to adhesion of the metal nitride film 7D with the second insulation film 6D.

As has been described, according to the fourth embodiment of the present invention, a highly reliable semiconductor device including a multi-layer interconnect with excellent adhesion between the metal compound film 7 as the second barrier metal film and the second insulation film 6 can be achieved.

Fifth Embodiment

Figure 5:
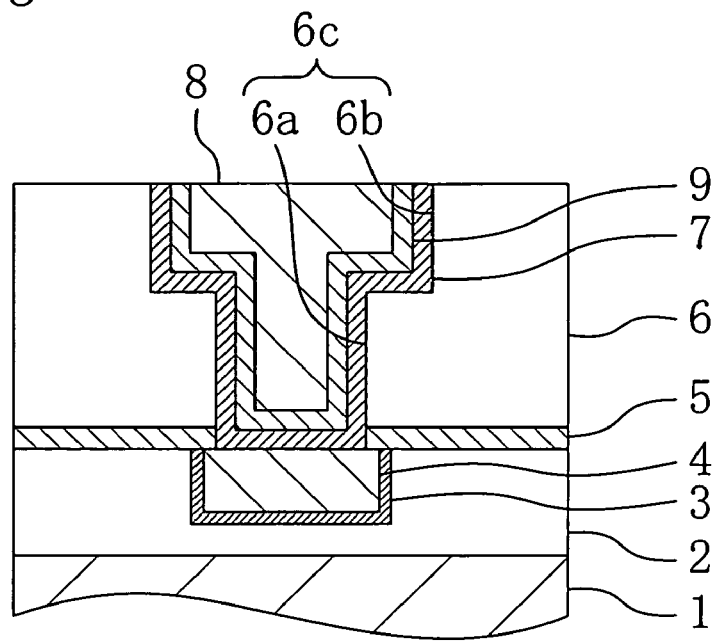
FIG. 5 is a cross-sectional view illustrating relevant part of a structure of a semiconductor device according to a fifth embodiment of the present invention.

Hereinafter, a semiconductor device according to a fifth embodiment of the present invention will be described with reference to FIG. 5. In the fifth embodiment, the description also shown in the first embodiment is not repeated. Hereinafter, the description will be given focusing on different points from the first embodiment. In FIG. 5, each member also shown in FIG. 1(*a*) is identified by the same reference numeral.

As shown in FIG. 5, the semiconductor device of the fifth embodiment is characterized by including a metal compound film 7 and a film 9 which is formed on the metal compound film 7 and includes one or more metal layers. The fifth embodiment is different from the first through fourth embodiments in this point.

It is preferable that the film 9 including one or more metal layers is a metal film, a metal compound film or a multi-layer film formed of a combination of films selected from the group consisting of a metal film and a metal compound film. Needless to say, a refractory metal(s) is suitable for a metal(s) forming the film 9 including one or more metal layers.

As described above, according to the fifth embodiment, a metal film having a lower resistivity than that of the metal compound film 7 or a multi-layer film including a metal film and a metal compound film is formed on a surface of the metal compound film 7 having a higher resistivity than that of a metal film. Thus, compared to each of the first through fourth embodiments in which a single-layer film of a metal compound film is used as the second barrier metal film, a low resistance second barrier metal film can be formed in the fifth embodiment.

As a metal forming the film 9 including one or more metal layers, titanium (Ti), zirconium (Zr), hafnium (Hf), tantalum (Ta), niobium (Nb), tungsten (W), vanadium (V), molybdenum (Mo), ruthenium (Ru), osmium (Os), rhodium (Rh), iridium (Ir), palladium (Pd) or platinum (Pt) is preferably used. For example, the resistivity of tantalum is 13 ($\mu\Omega\cdot$cm), the resistivity of ruthenium is 7.5 ($\mu\Omega\cdot$cm) and the resistivity of iridium is 6.5 ($\mu\Omega\cdot$cm).

When a metal oxide film is used as a metal compound film forming the film 9 including one or more metal layers, vanadium (V), molybdenum (Mo), ruthenium (Ru), osmium (Os), rhodium (Rh), iridium (Ir), palladium (Pd), platinum (Pt) or the like is preferably used as the metal. For example, the resistivity of a ruthenium oxide film is 35 ($\mu\Omega\cdot$cm) and the resistivity of an iridium oxide film is 30 ($\mu\Omega\cdot$cm). With use of these metals, since the metals do not loose their conductivity (or have a low resistivity) when being oxidized, a low resistance second barrier metal film can be obtained.

When a metal nitride film is used as a metal compound film forming the film 9 including one or more metal layers, titanium (Ti), tantalum (Ta), zirconium (Zr), niobium (Nb), hafnium (Hf), tungsten (W) or the like is preferably used as the metal. For example, the resistivity of a titanium nitride film is 25 ($\mu\Omega\cdot$cm) and the resistivity of a tantalum nitride film is 130 ($\mu\Omega\cdot$cm). With use of these metals, the resistivity of a metal nitride film becomes low and thus a low resistance second barrier metal film can be obtained.

In this embodiment, when the metal compound film 7 is formed of a metal nitride film, the second insulation film 6A described as the second insulation film 6 in the first embodiment is used. Thus, a highly reliable semiconductor device including a multi-layer interconnect with excellent adhesion between the metal compound film 7 as the second barrier metal film and the second insulation film 6 can be achieved.

In this embodiment, when the metal compound film 7 is formed of a metal oxide film, the second insulation film 6B described as the second insulation film 6 in the second embodiment is used. Thus, a highly reliable semiconductor device including a multi-layer interconnect with excellent adhesion between the metal compound film 7 as the second barrier metal film and the second insulation film 6 can be achieved.

In this embodiment, when the metal compound film 7 is a metal carbide film, the second insulation film 6C described as the second insulation film 6 in the third embodiment is used, a highly reliable semiconductor device including a multi-layer interconnect with excellent adhesion between the metal compound film 7 as the second barrier metal film and the second insulation film 6 can be achieved.

In this embodiment, when the metal compound film 7 is a metal silicide film, the second insulation film 6D described as the second insulation film 6 in the fourth embodiment is used. Thus, a highly reliable semiconductor device including a metal interconnect with more excellent adhesion between the metal compound film 7 as the second barrier metal film and the second insulation film 6 can be achieved.

As has been described, according to the fifth embodiment of the present invention, a highly reliable semiconductor device in which a multi-layer interconnect including a barrier metal film with a low resistance and excellent adhesion is provided can be achieved.

Sixth Embodiment

Figure 6:
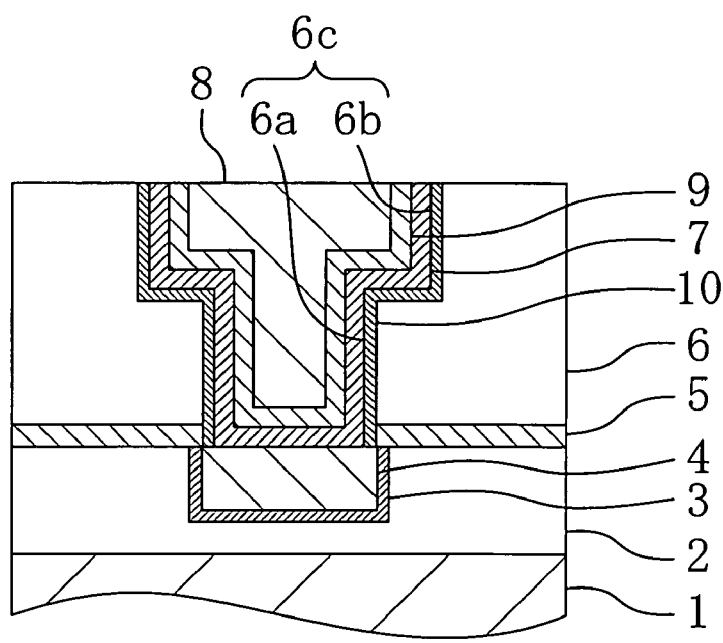
FIG. 6 is a cross-sectional view illustrating relevant part of a structure of a semiconductor device according to a sixth embodiment of the present invention.

Hereinafter, a semiconductor device according to a sixth embodiment of the present invention will be described with reference to FIG. 6. In the sixth embodiment, the description also shown in the fifth embodiment is not repeated. Hereinafter, the description will be given focusing on different points from the fifth embodiment. In FIG. 6, each member also shown in FIG. 5 is identified by the same reference numeral.

As shown in FIG. 6, a semiconductor device according to the sixth embodiment is characterized in that a third insulation film 10 is formed between a metal compound film 7 and a second insulation film 6 and the metal compound film 7 contains at least one of elements forming the third insulation film 10. The sixth embodiment is different from the fifth embodiment in this point.

As described above, the second insulation film 6 and the third insulation film 10 are both insulation films and adhesion thereof is better than that of a combination of a metal and an insulation film or a combination of a metal compound film and an insulation film. Therefore, the degree of freedom of a combination of the third insulation film 10 and the metal compound film 7 selected for improving adhesion can be increased.

Therefore, to achieve the same combination of the second insulation film 6 and the metal compound film 7 as the combination thereof described in each of the first through fourth embodiments, an insulation film suitable to the metal compound film 7 forming a second barrier metal film is preferably determined as the third insulation film 10. Thus, the degree of design of a semiconductor device can be increased.

In FIG. 6, the structure in which a film 9 including one or more metal layers is formed is shown. However, the structure in which the film 9 including one or more metal layers is not formed may be used.

As has been described, the insulation film 10 is selected so that the same combination of the second insulation film 6 and the metal compound film 7 as the combination thereof described in each of the first through fourth embodiments is satisfied. Therefore, a highly reliable semiconductor device including a multi-layer interconnect with a low resistance and excellent barrier metal film can be achieved.

Seventh Embodiment

Hereinafter, a method for fabricating a semiconductor device according to a seventh embodiment of the present invention will be described with reference to FIGS. 7(a) through 7(c).

Figure 7A:
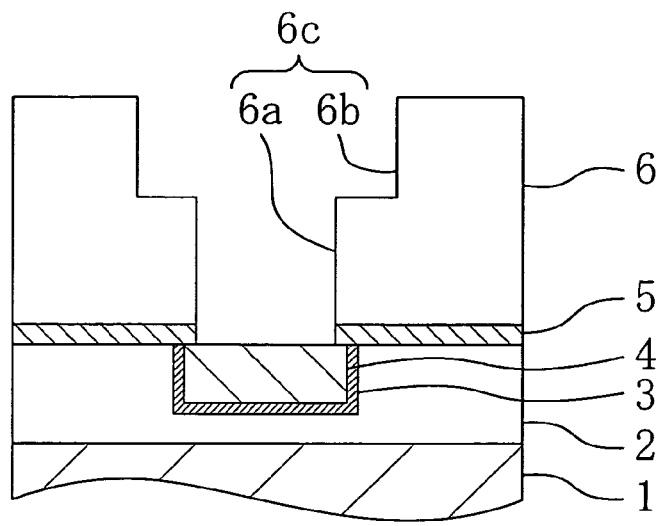
FIGS. 7(a) through (c) are cross-sectional views of relevant part of a semiconductor device according to a seventh embodiment of the present invention illustrating respective steps for fabricating the semiconductor device.
Figure 7B:
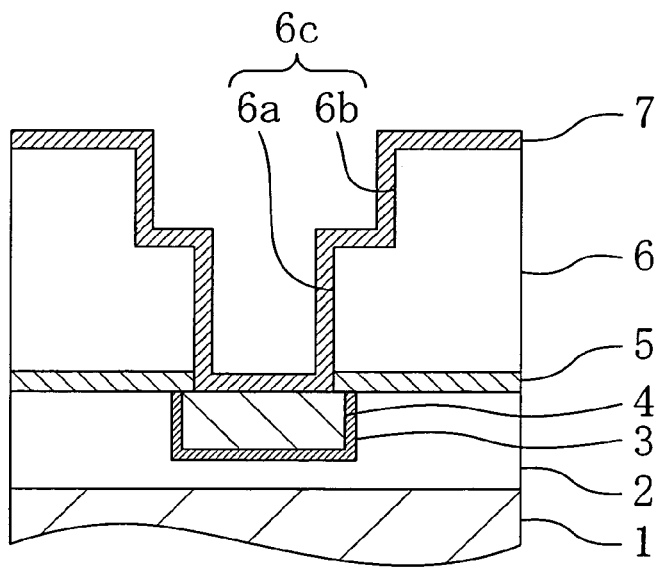
Figure 7C:
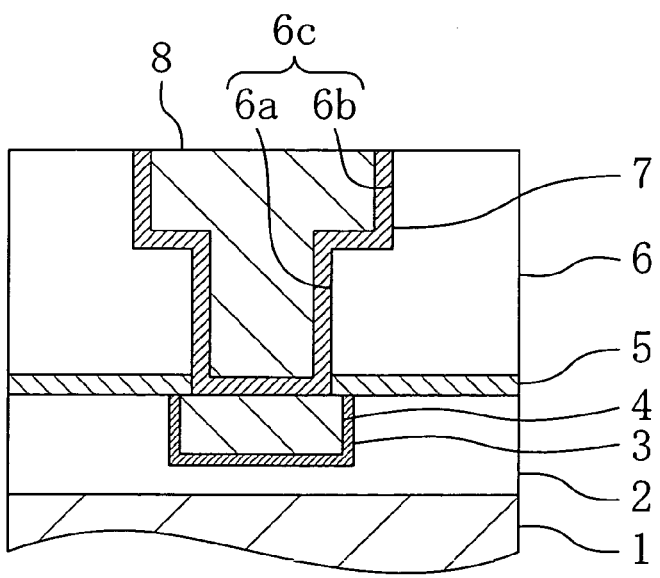

FIGS. 7(a) through 7(c) are cross-sectional views of relevant part of a semiconductor device according to the seventh embodiment of the present invention illustrating respective steps for fabricating the semiconductor device.

As shown in FIG. 7(a), a first insulation film 2 is formed on a silicon substrate 1 and then a first interconnect 4 which is a copper interconnect of a lower layer including a first barrier metal film 3 is formed in the insulation film 2. On the silicon substrate 1, a transistor and the like (not shown) are formed. A dielectric barrier film 5 for preventing diffusion of copper and a second insulation film 6 are formed in this order over the first insulation film 2 and the first interconnect 4. Thus, an insulation layer including the dielectric barrier film 5 and the second insulation film 6 is obtained.

Next, a via hole 6a is formed in the dielectric barrier film 5 and the second insulation film 6 so as to reach the first interconnect 4 and an interconnect trench 6b is formed in the second insulation film 6 so as to communicate to the via hole 6a. Thus, a recess portion 6c which is to be a dual damascene interconnect trench including the via hole 6a and the interconnect trench 6b is formed. The via hole 6a and the interconnect trench 6b are formed by process steps of a dual damascene interconnect trench (i.e., the recess portion 6c including the via hole 6a and the interconnect trench 6b) using known lithography, etching, ashing and cleaning. In general, a method in which the via hole 6a is first formed and then the interconnect (trench) 6b is formed has been widely used.

Next, as shown in FIG. 7(b), a metal compound film 7 as a second barrier metal film is formed on the second insulation film 6 as well as the inside of the recess portion 6c by physical vapor deposition (PVD). In this case, the metal compound film 7 is formed of a film containing at least one of elements forming the second insulation film 6. The metal compound film 7 is formed in order to prevent diffusion of copper into the second insulation film 6 and also to improve adhesion between the second insulation film 6 and a second interconnect 8 which will be described later. Moreover, the metal compound film 7 may be formed by some other method than physical vapor deposition, i.e., atomic layer deposition (ALD), chemical vapor deposition (CVD) or the like.

Next, as shown in FIG. 7(c), a copper seed layer is formed on the metal compound film 7 by physical vapor deposition and then a copper film is formed by copper electroplating using the copper seed layer as a seed so as to fill the recess portion 6c and cover an entire surface of the second insulation film 6. Subsequently, parts of the copper film and the metal compound film 7 located on the second insulation film 6, except for parts thereof located inside the recess portion 6c, are removed by chemical mechanical polishing (CMP). Thus, as shown in FIG. 7(c), a second interconnect 8 and a via plug which is part of the second interconnect 8 are simultaneously formed. Note that the second interconnect 8 may be an interconnect, a via plug or a combination of an interconnect and a via plug. Moreover, a multi-layer interconnect is formed by repeating a series of process steps from formation of the dielectric barrier film 5 to chemical mechanical polishing. In this embodiment, the case where a dual damascene technique is used has been described. However, a single damascene technique may be used. In such a case, an interconnect and a via plug which is part of the interconnect are alternately formed.

As the dielectric barrier film 5, a silicon nitride film, a silicon nitride carbide film, a silicon carbide oxide film, a silicon carbide film, or an insulation film such as a lamination film of a combination of these films is preferably used. The dielectric barrier film 5 has the function of preventing diffusion of copper of the first interconnect 4 into the second insulation film 6.

As the second insulation film 6, a silicon oxide film, a silicon oxide fluoride film, a silicon oxide carbide film, a silicon carbide oxide film, a silicon oxide carbide nitride film, a silicon carbide film, a silicon carbide nitride film, a silicon nitride film or an insulation film formed of an organic film is used. Each of the films may be a film formed by chemical vapor deposition or a SOD (spin on dielectric) film formed by spin coating.

As a metal forming the metal compound film 7, a refractory metal is preferably used. Thus, in the process step of forming an interconnect of an upper layer after formation of the second interconnect 8, even when heat of about 400° C. is applied, the metal compound film 7 is not altered by the heat treatment. Therefore, a highly reliable semiconductor device can be achieved.

When the metal compound film 7 as a second barrier metal film is incorporated in an actual semiconductor device, the metal compound film 7 is preferably formed so as to have a thickness of about several to 30 nm in a 65 nm generation semiconductor device. In a 45 nm generation semiconductor device, it is expected that the thickness of the second barrier metal film as a whole has to be about 15 nm or less at most. A method for forming the metal compound film 7 is preferably optimized in an arbitrary manner according to its application.

As a material of the second interconnect 8, some other metal than copper, i.e., a low resistance metal such as silver, gold and platinum is preferably used. Thus, a low resistance multi-layer interconnect can be formed. It is more preferable that as a material of the second interconnect 8, copper or a copper alloy (i.e., an alloy containing copper as a main component and partially containing some other metal) is used. Thus, a semiconductor device including a multi-layer interconnect with a low resistance can be fabricated at low cost.

The method for fabricating a semiconductor device according to the seventh embodiment is characterized in that the metal compound film 7 formed of a film including at least one of elements of the insulation film 6. Thus, a common element of the second insulation film 6 and the metal compound film 7 exists at an interface between the metal compound film 7 and the second insulation film 6, so that adhesion between the metal compound film 7 and the second insulation film 6 is remarkably improved, compared to the case where the common element does not exist at the interface between the metal compound film 7 and the second insulation film 6. The reason for this is that in forming the metal compound film 7 on a surface of the second insulation film 6, biding between the metal compound film 7 and the second insulation film 7 becomes stronger because of the existence of the common element and the interface becomes an almost seamless state. Therefore, a highly reliable semiconductor device including a multi-layer interconnect with excellent adhesion can be fabricated.

In this embodiment, when the metal compound film 7 is formed of a metal nitride film, the second insulation film 6A described as the second insulation film 6 in the first embodiment is used. Thus, a highly reliable semiconductor device including a multi-layer interconnect with excellent adhesion between the metal compound film 7 as the second barrier metal film and the second insulation film 6A can be achieved.

In this embodiment, when the metal compound film 7 is formed of a metal oxide film, the second insulation film 6B described as the second insulation film 6 in the second embodiment is used. Thus, a highly reliable semiconductor device including a multi-layer interconnect with excellent adhesion between the metal compound film 7 as the second barrier metal film and the second insulation film 6 can be achieved.

In this embodiment, when the metal compound film 7 is a metal carbide film, the second insulation film 6C described as the second insulation film 6 in the third embodiment is used. Thus, a highly reliable semiconductor device including a multi-layer interconnect with excellent adhesion between the metal compound film 7 as the second barrier metal film and the second insulation film 6 can be achieved.

In this embodiment, when the metal compound film 7 is formed of a metal silicide film, the second insulation film 6D described as the second insulation film 6 in the fourth embodiment is used. Thus, a highly reliable semiconductor device including a multi-layer interconnect with excellent adhesion between the metal compound film 7 as the second barrier metal film and the second insulation film 6 can be achieved.

As has been described, according to the seventh embodiment of the present invention, a highly reliable semiconductor device in which a multi-layer interconnect including a barrier metal film with a low resistance and excellent adhesion can be fabricated.

In this embodiment, the case where a dual damascene structure is adopted has been described. However, even when a single damascene structure in which an interconnect and a via plug which is part of the interconnect are formed is adopted, the same effects as those described above can be achieved.

Eighth Embodiment

Hereinafter, a method for fabricating a semiconductor device according to an eighth embodiment of the present invention will be described with FIGS. 8(*a*) and 8(*b*) and FIGS. 9(*a*) and 9(*b*).

Figure 8A:
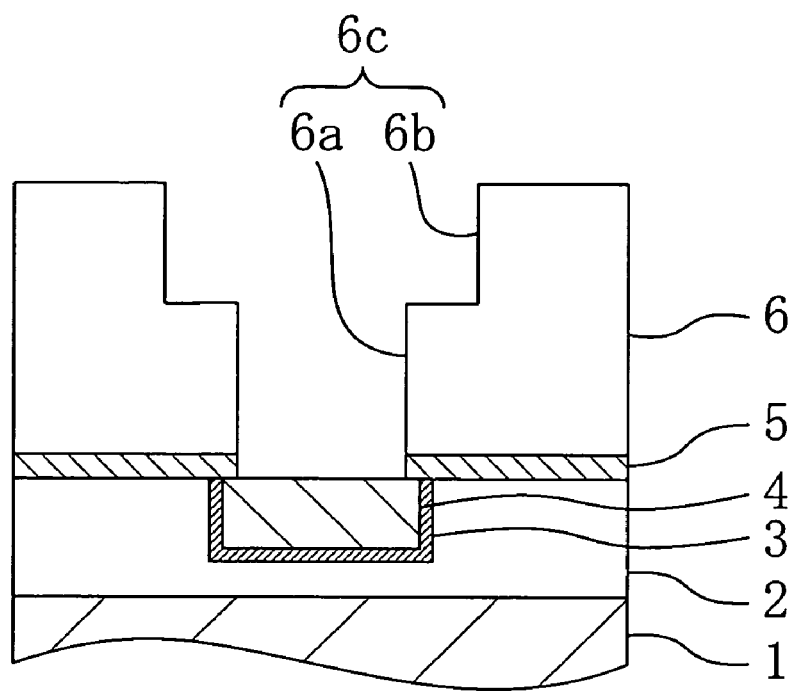
FIGS. 8(a) and 8(b) are cross-sectional views of relevant part of a semiconductor device according to an eighth embodiment of the present invention illustrating respective steps for fabricating the semiconductor device.
Figure 8B:
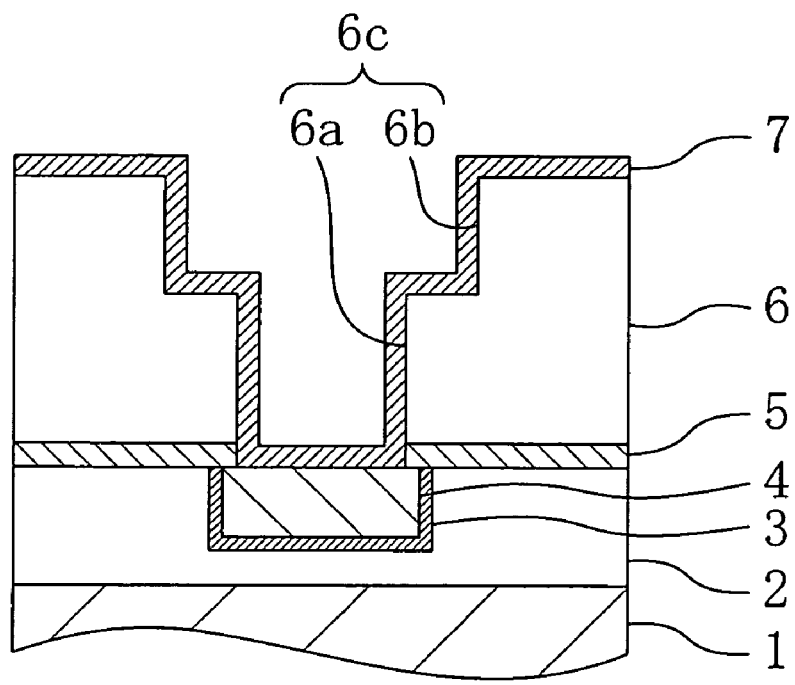

FIGS. 8(*a*) and 8(*b*) and FIGS. 9(*a*) and 9(*b*) are cross-sectional views of relevant part of a semiconductor device according to the seventh embodiment of the present invention illustrating respective steps for fabricating the semiconductor device. In FIGS. 8(*a*) and 8(*b*) and FIGS. 9(*a*) and 9(*b*), each member also shown in FIGS. 7(*a*) and 7(*b*) is identified by the same reference numeral.

As shown in FIG. 8(*a*), a first insulation film 2 is formed on a silicon substrate 1 and then a first interconnect 4 which is a copper interconnect of a lower layer including a first barrier metal film 3 is formed in the first insulation film 2. On the silicon substrate 1, a transistor and the like (not shown) are formed. A dielectric barrier film 5 for preventing diffusion of copper and the second insulation film 6 are formed in this order over the first insulation film 2 and the first interconnect 4. Thus, an insulation layer including the dielectric barrier film 5 and the second insulation film 6 is formed.

Next, a via hole 6*a* is formed in the dielectric barrier film 5 and the second insulation film 6 so as to reach the first interconnect 4 and an interconnect trench 6*b* is formed in the second insulation film 6 so as to communicate to the via hole 6*a*. Thus, a recess portion 6*c* which is to be a dual damascene interconnect trench including the via hole 6*a* and the interconnect trench 6*b* is formed. The via hole 6*a* and the interconnect trench 6*b* are formed by process steps of a dual damascene interconnect trench (i.e., the recess portion 6*c* including the via hole 6*a* and the interconnect trench 6*b*) using known lithography, etching, ashing and cleaning. In general, a method in which the via hole 6*a* is first formed and then the interconnect (trench) 6*b* is formed has been widely used.

Next, as shown in FIG. 8(*b*), a metal compound film 7 as a second barrier metal film is formed on the second insulation film 6 as well as the inside of the recess portion 6*c* by physical vapor deposition (PDV). In this case, the metal compound film 7 is a film containing at least one of elements forming the second insulation film 6. Moreover, the metal compound film 7 is formed in order to prevent diffusion of copper into the second insulation film 6 and also to improve adhesion between the second insulation film 6 and a second interconnect 8 which will be described later. Moreover, the metal compound film 7 may be formed by some other method than physical vapor deposition, i.e., atomic layer deposition (ALD), chemical vapor deposition (CVD) or like the like.

Figure 9A:
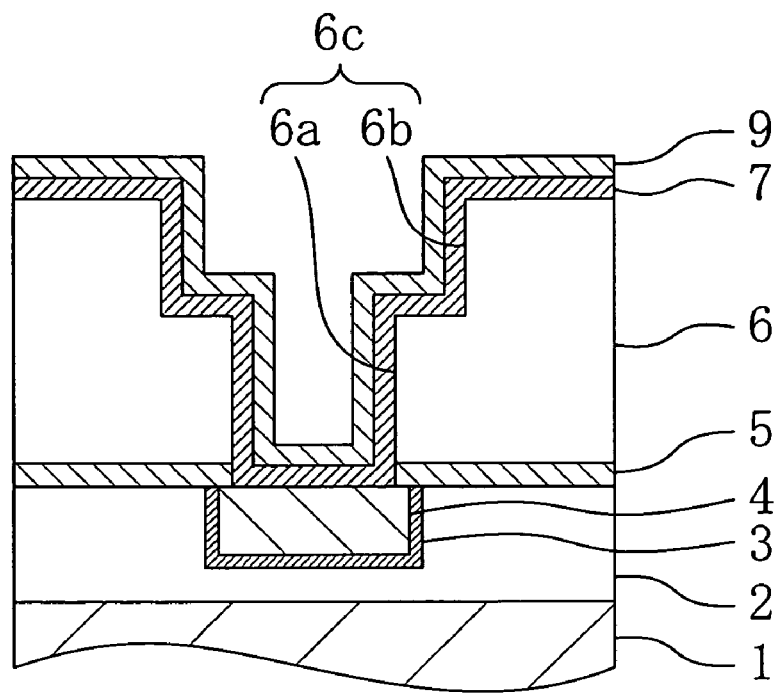
FIGS. 9(a) and 9(b) are cross-sectional views of relevant part of a semiconductor device according to the eighth embodiment of the present invention illustrating respective steps for fabricating the semiconductor device.

Next, as shown in FIG. 9(a), a film 9 including one or more metal layers is formed on the metal compound film 7.

Figure 9B:
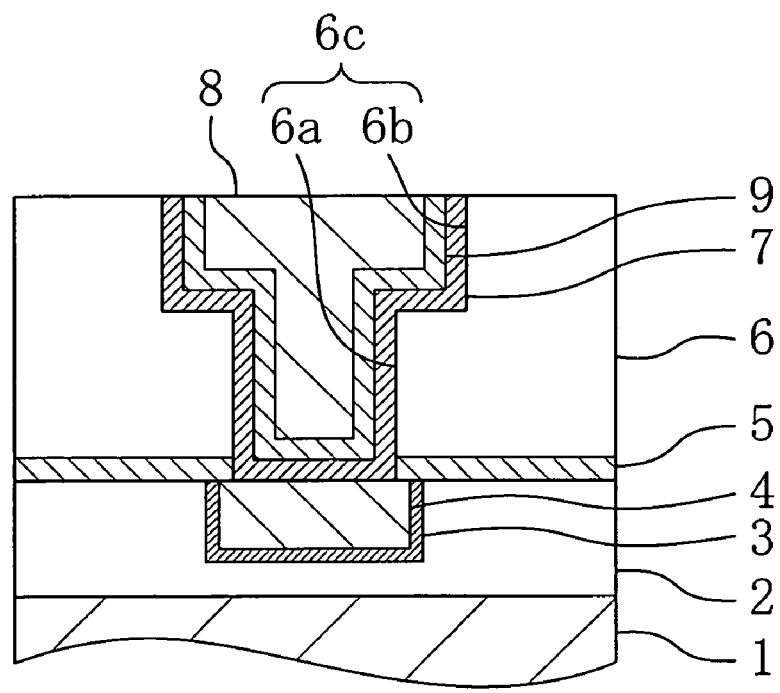

Next, as shown in FIG. 9(b), a copper seed layer is formed on the film 9 including one or more metal layers by physical vapor deposition and then a copper film is formed by copper electroplating using the copper seed layer as a seed so as to fill the recess portion 6c and cover an entire surface of the film 9 including one or more metal layers. Note that the copper seed layer is not necessarily formed. Subsequently, parts of the copper film and the metal compound film 7 located on the film including one or more metal-containing layers, except for parts thereof located inside the recess portion 6c is removed by chemical mechanical polishing (CMP) or the like. Thus, as shown in FIG. 9(b), a second interconnect 8 and a via plug which is part of the second interconnect 8 are simultaneously formed. Note that the second interconnect 8 may be an interconnect, a via plug or a combination of an interconnect and a via plug. Moreover, a multi-layer interconnect is formed by repeating a series of process steps from formation of the dielectric barrier film 5 to chemical mechanical polishing. In this embodiment, the case where a dual damascene technique is used has been described. However, a single damascene technique may be used. In such a case, an interconnect and a via plug which is part of the interconnect are alternately formed.

Now, features of the semiconductor device of the eighth embodiment of the present invention will be described focusing on different points from the second embodiment.

The method for fabricating a semiconductor device according to the eighth embodiment of the present invention is characterized by including, after formation of the metal compound film 7, the process step of forming the film 9 including one or more metal layers. The method of the eighth embodiment is different from the method for fabricating a semiconductor device according to the seventh embodiment in this point.

It is preferable that the film 9 including one or more metal layers is a metal film, a metal compound film or a multi-layer film of a combination of a metal film and a metal compound film. Moreover, needless to say, a refractory metal is suitable for a metal forming the film 9.

As has been described, according to the eighth embodiment, a metal film having a lower resistance than that of the metal compound film 7 or a multi-layer film including a metal film and a metal compound film is formed on a surface of the metal compound film 7 having a higher resistance than that of a metal film. Thus, compared to the seventh embodiment in which a single-layer film of a metal compound film is used as a second barrier metal film, a low resistance second barrier metal film can be formed in the eighth embodiment.

As a metal forming the film 9, titanium (Ti), zirconium (Zr), hafnium (Hf), tantalum (Ta), niobium (Nb), tungsten (W), vanadium (V), molybdenum (Mo), ruthenium (Ru), osmium (Os), rhodium (Rh), iridium (Ir), palladium (Pd) or platinum (Pt) is preferably used. For example, the resistivity of tantalum is 13 ($\mu\Omega \cdot cm$), the resistivity of ruthenium is 7.5 ($\mu\Omega \cdot cm$) and the resistivity of iridium is 6.5 ($\mu\Omega \cdot cm$).

Moreover, when a metal oxide film is used as a metal compound film forming the film 9 including one or more metal layers, as a metal for the metal oxide film, vanadium (V), molybdenum (Mo), ruthenium (Ru), osmium (Os), rhodium (Rh), iridium (Ir), palladium (Pd), platinum (Pt) or the like is preferably used. For example, the resistivity of a ruthenium oxide film is 35 ($\mu\Omega \cdot cm$) and the resistivity of an iridium oxide film is 30 ($\mu\Omega \cdot cm$). With use of these metals, since these metals are metals which do not loose their conductivity (or have a low resistivity) when being oxidized, a low resistance second barrier metal film can be formed.

Moreover, when a metal nitride film is used as a metal compound film forming the film 9 including one or more metal layers, as a metal for the metal nitride film, titanium (Ti), tantalum (Ta), zirconium (Zr), niobium (Nb), hafnium (Hf), tungsten (W) or the like is preferably used. The resistivity of a titanium nitride film is 25 ($\mu\Omega \cdot cm$) and the resistivity of a tantalum nitride film is 130 ($\mu\Omega \cdot cm$). With use of these metals, the resistivity of the metal nitride film becomes low and thus a low resistance second barrier metal film can be obtained.

If a metal compound film has a low resistivity, the metal compound film can be used as a metal compound film forming the film 9 including one or more metal layers. A metal carbide film or a metal silicide film may be used. Furthermore, some other metal compound film having a low resistivity can be used as a compound film forming the film 9 including one or more metal layers.

Moreover, with use of a lamination film formed of the above-described combination of a metal and a metal compound film, the effect of preventing copper diffusion and reduction in resistance can be achieved at the same time. Thus, use of the lamination film as the second barrier metal film 6 is effective. As a matter of course, it is more preferable that to improve adhesion of the inside of the film 9 including one or more metal layers and adhesion between the film 9 including one or more metal layers and the metal compound film 7, a lamination film including a metal and a metal compound film as the film 9 including one or more metal layers is formed.

The combination of the metal compound film 7 and the second insulation film 6 and the effects of the combination are the same as those described in each of the first through fourth embodiments.

Therefore, according to this embodiment, a metal film having a lower resistance than that of the metal compound film 7 and a multi-layer film formed of a metal film and a metal compound film is formed on a surface of the metal compound film 7 having a higher resistivity than that of a metal film. Thus, compared to the seventh embodiment in which a single-layer film of the metal compound film 7 is used as the second barrier metal film, a barrier metal film having a low resistance can be formed in the eighth embodiment.

Note that in this embodiment, the case where a dual damascene structure is adopted has been described. However, even a single damascene structure in which an interconnect and a via plug which is part of the interconnect is adopted, the same effects as those described above can be achieved.

As has been described, according to the eighth embodiment of the present invention, excellent adhesion can be achieved between any adjacent two of the second insulation film 6, the second barrier metal film including the metal compound film 7 and the film 9 including one or more metal layers and the second interconnect 8. Accordingly, a multi-layer interconnect including a barrier metal film with excellent adhesion can be achieved. Therefore, a highly reliable semiconductor device can be fabricated.

Ninth Embodiment

Figure 10A:
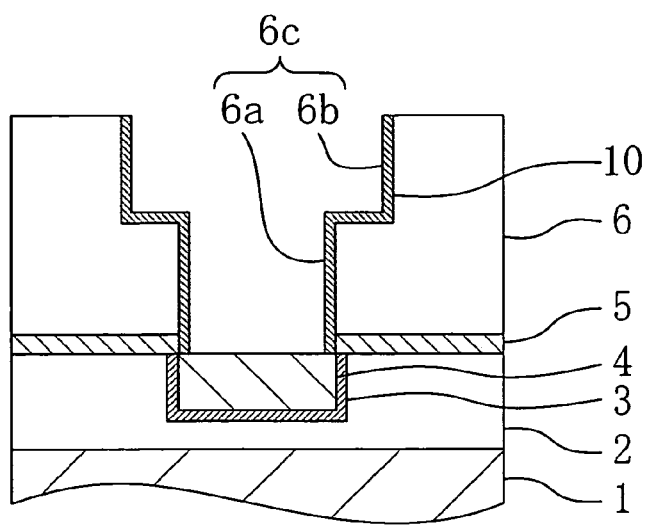
FIGS. 10(a) through (c) are cross-sectional views of relevant part of a semiconductor device according to a ninth embodiment of the present invention illustrating respective steps for fabricating the semiconductor device.
Figure 10B:
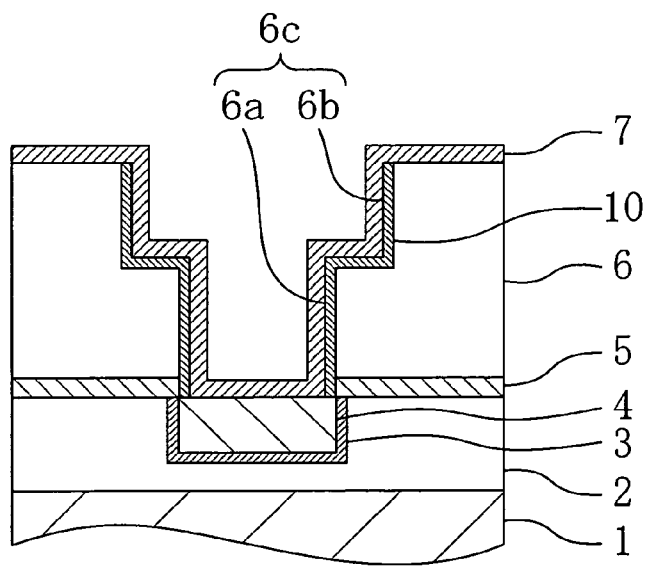
Figure 10C:
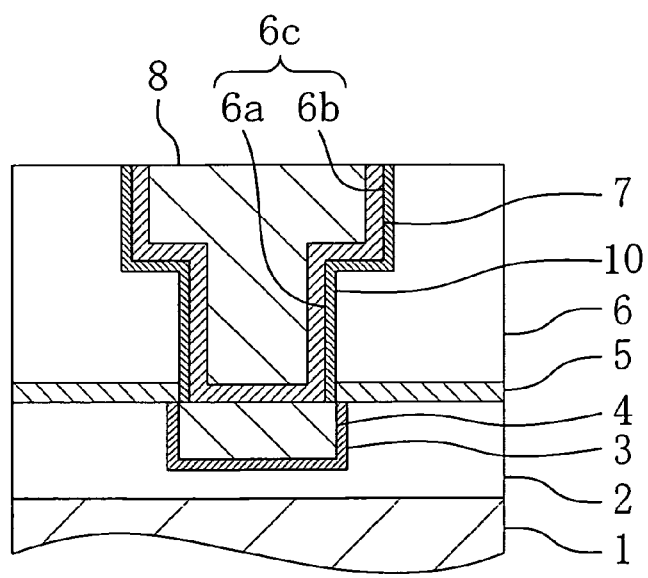
Figure 11:
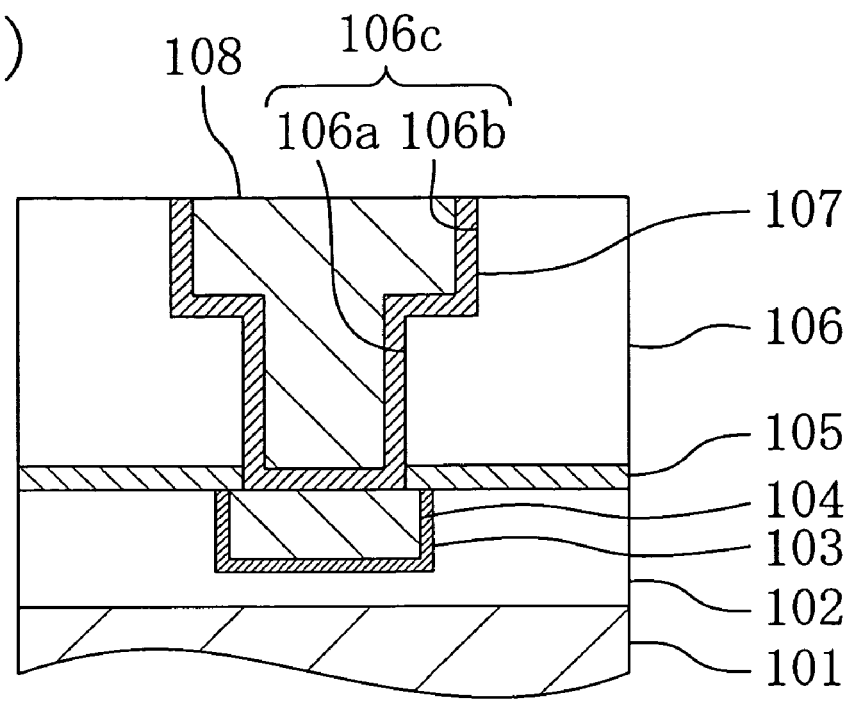
FIG. 11 is a cross-sectional view illustrating respective steps for fabricating a known semiconductor device.
Figure 11:
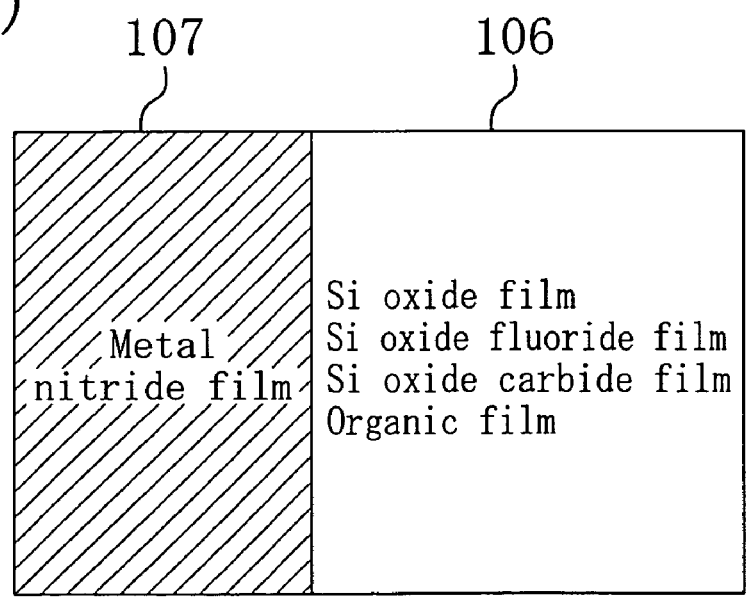

Hereinafter, a method for fabricating a semiconductor device according to a ninth embodiment of the present invention will be described with reference to FIGS. 10(a) through 10(c). FIGS. 10(a) through 10(c) are cross-sectional views illustrating respective steps for fabricating a semiconductor device according to the ninth embodiment of the present invention. In the ninth embodiment, the description also shown in the seventh embodiment is not repeated. Hereinafter, the description will be given focusing on different points from the first embodiment. In FIGS. 10(a) through 10(c), each member also shown in FIGS. 7(a) through 7(c) is identified by the same reference numeral.

As shown in FIG. 10(a), the method for fabricating a semiconductor device according to the ninth embodiment is characterized by including, after the process step of forming a recess portion 6c which is a dual damascene trench, the process step of forming a third insulation film 10 on a second insulation film 6 as well as the inside of the recess portion 6c. After formation of the third insulation film 10, as shown in FIG. 10(b), a metal compound film 7 including at least one of elements forming the third insulation film 10 is formed on the third insulation film 10. Subsequently, as shown in FIG. 10(c), a second interconnect 8 which is a dual damascene interconnect is formed in the same manner as in the seventh embodiment.

Thus, since the second insulation film 6 and the third insulation film 10 are both insulation films, adhesion between the second insulation film 6 and the third insulation film 10 is higher than adhesion between a metal and an insulation film or a metal compound film and an insulation film. Therefore, the degree of freedom of a combination of the third insulation film 10 and the metal compound film 7 selected for improving adhesion therebetween can be increased.

For a combination of the metal compound film 7 and the third insulation film 10, it is preferably to determined to use an insulation film suitable for the metal compound film 7 forming the second barrier metal film as the third insulation film 10, in the same manner as in determining the combination of the metal compound film 7 and the second insulation film 6 in each of the above-described first through fourth embodiments. In this case, for adhesion between the metal compound film 7 and the third insulation film 10, the same effects as those for adhesion between the metal compound film 7 and the second insulation film 6 described in each of the first through fourth embodiments can be achieved. Therefore, the number of choices for selecting a combination of the metal compound film 7 and the third insulation film 10 is increased. Accordingly, the degree of freedom of design of a semiconductor device can be increased.

As described above, the third insulation film 10 is selected in the same manner as in selecting the second insulation film 6 and the metal compound film 7 described in each of the first through fourth embodiments, so that a highly reliable semiconductor device including a barrier metal film with a low resistance and excellent adhesion can be achieved.

Moreover, by combining the eighth embodiment and the ninth embodiment, the effects of both of the embodiments can be achieved. Specifically, by adding the process step of forming the film 9 including one or more metal layers after the process step of forming the metal compound film 7 of this embodiment, a metal film having a lower resistance than that of the metal compound film 7 or a multi-layer film including a metal film and a metal compound film is formed on a surface of the metal compound film 7 having a higher than that of a metal film. Thus, compared to the eighth embodiment in which a single-layer film of the metal compound film 7 is used as the second barrier metal film, a low resistance barrier metal film can be formed.

Note that in this embodiment, the case where a dual damascene structure is adopted has been described. However, even when a single damascene structure in which an interconnect and a via plug which is part of the interconnect is adopted, the same effects as those described above can be achieved.

As has been described, according to the ninth embodiment, a highly reliable semiconductor device in which a multi-layer interconnect including a barrier metal film with a low resistance and excellent adhesion can be achieved.

INDUSTRIAL APPLICABILITY

As has been described, the present invention is useful for a semiconductor device including a barrier metal film with a low resistance and excellent adhesion and a method for fabricating the semiconductor device.

The invention claimed is:

1. A semiconductor device comprising:
an insulation film formed on a substrate;
a buried metal interconnect formed in the insulation film; and
a barrier metal film formed between the insulation film and the metal interconnect,
wherein the barrier metal film is a metal oxide film, and
wherein the metal oxide film contains at least one of the elements forming the insulation film and is made of at least one selected from a group consisting of Zr, Hf, W, V, Mo, Os, Rh, Ir, Pd and Pt or any alloy thereof.

2. The semiconductor device of claim 1, wherein a metal forming the metal oxide film is a refractory metal.

3. The semiconductor device of claim 1, wherein the metal interconnect is formed of copper or an copper alloy.

4. The semiconductor device of claim 1, wherein the insulation film is $SiO_2$, $SiOF_2$, SiOC, SiON, SiOCN, or an organic film containing oxygen.

5. The semiconductor device of claim 1, wherein the insulation film is nitride, carbide or silicide.

* * * * *